US012659653B2

(12) United States Patent
Ayazi et al.

(10) Patent No.: US 12,659,653 B2
(45) Date of Patent: Jun. 16, 2026

(54) ACCELEROMETER CONTACT MICROPHONES AND METHODS THEREOF

(71) Applicant: Georgia Tech Research Corporation, Atlanta, GA (US)

(72) Inventors: Farrokh Ayazi, Atlanta, GA (US); Pranav Gupta, Atlanta, GA (US); Yaesuk Jeong, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 474 days.

(21) Appl. No.: 18/311,264

(22) Filed: May 3, 2023

(65) Prior Publication Data

US 2023/0276171 A1 Aug. 31, 2023

Related U.S. Application Data

(63) Continuation of application No. 17/048,816, filed as application No. PCT/US2019/024679 on Mar. 28, 2019, now Pat. No. 11,678,113.

(Continued)

(51) Int. Cl.
*H04R 1/46* (2006.01)
*B81B 7/02* (2006.01)
(Continued)

(52) U.S. Cl.
CPC ............... *H04R 1/46* (2013.01); *B81B 7/02* (2013.01); *G01P 15/097* (2013.01);
(Continued)

(58) Field of Classification Search
CPC . H04R 1/46; H04R 1/04; H04R 19/04; H04R 2201/003; H04R 19/005;
(Continued)

(56) References Cited

U.S. PATENT DOCUMENTS 7,923,790 B1* 4/2011 Quevy ................ B81C 1/00293
257/415
8,375,788 B2* 2/2013 Robert ................ G01C 19/574
73/504.12

(Continued)

FOREIGN PATENT DOCUMENTS

WO 2013184437 A2 12/2013

OTHER PUBLICATIONS

Search Report from EP Application No. 19788901.7 dated Apr. 22, 2022.

(Continued)

*Primary Examiner* — Oyesola C Ojo
(74) *Attorney, Agent, or Firm* — TROUTMAN PEPPER LOCKE LLP; Ryan A. Schneider; Nicholas H. Doss

(57) ABSTRACT

Small form-factor MEMS devices and methods of using the devices. An exemplary MEMS device includes an ACM. Certain devices comprise nanometer scale sensing gaps in the out-of-plane direction to increase vibration sensitivity in a vacuum casing. Certain devices described herein provide a differential sensing mechanism. Accelerometer contact microphones having an operational bandwidth ranging from 0 Hz and 10,000 Hz are also disclosed. The vibration acceleration sensitivity of certain devices described herein is better 100 µg√Hz.

21 Claims, 17 Drawing Sheets

Related U.S. Application Data

(60) Provisional application No. 62/659,387, filed on Apr. 18, 2018.

(51) Int. Cl.

| | |
|---|---|
| *G01P 15/097* | (2006.01) |
| *G01P 15/125* | (2006.01) |
| *H04R 1/04* | (2006.01) |
| *H04R 19/04* | (2006.01) |

(52) U.S. Cl.
CPC .............. *G01P 15/125* (2013.01); *H04R 1/04* (2013.01); *H04R 19/04* (2013.01); *B81B 2201/0235* (2013.01); *B81B 2201/0257* (2013.01); *B81B 2203/0154* (2013.01); *B81B 2203/04* (2013.01); *H04R 2201/003* (2013.01)

(58) Field of Classification Search
CPC .............. B81B 7/02; B81B 2201/0235; B81B 2201/0257; B81B 2203/0154; B81B 2203/04; G01P 15/097; G01P 15/125; G01H 11/00
See application file for complete search history.

(56) References Cited

U.S. PATENT DOCUMENTS

| | | | | |
|---|---|---|---|---|
| 9,516,442 | B1 * | 12/2016 | Dusan ................. | H04R 1/1016 |
| 9,900,677 | B2 * | 2/2018 | Hung ................. | A61B 5/02028 |
| 10,024,879 | B2 * | 7/2018 | Clark ................. | G01C 19/5726 |
| 11,406,354 | B2 * | 8/2022 | Rodriquez .............. | A61B 8/06 |
| 2004/0182155 | A1 * | 9/2004 | Najafi .................... | G01P 15/18 |
| | | | | 73/514.32 |
| 2006/0272414 | A1 * | 12/2006 | Ayazi ................. | G01P 15/0802 |
| | | | | 73/514.32 |
| 2008/0013747 | A1 | 1/2008 | Tran | |

| | | | | |
|---|---|---|---|---|
| 2010/0217345 | A1 * | 8/2010 | Wolfe ...................... | A61B 7/04 |
| | | | | 600/528 |
| 2011/0098583 | A1 * | 4/2011 | Pandia .................. | A61B 5/029 |
| | | | | 375/259 |
| 2011/0105932 | A1 * | 5/2011 | Bauer .................. | A61B 5/4818 |
| | | | | 600/528 |
| 2011/0137209 | A1 * | 6/2011 | Lahiji .................... | H04R 1/406 |
| | | | | 600/586 |
| 2011/0184302 | A1 * | 7/2011 | Eschler .................... | A61B 5/08 |
| | | | | 600/529 |
| 2011/0314924 | A1 * | 12/2011 | Chandrasekharan .. | G01N 13/00 |
| | | | | 29/847 |
| 2012/0029345 | A1 * | 2/2012 | Mahfouz ............... | A61B 5/743 |
| | | | | 600/595 |
| 2012/0167685 | A1 * | 7/2012 | Guo ...................... | G01P 15/125 |
| | | | | 73/514.32 |
| 2012/0209132 | A1 * | 8/2012 | Jones .................... | A61B 7/026 |
| | | | | 600/528 |
| 2013/0276510 | A1 * | 10/2013 | Valdevit .................. | G01L 25/00 |
| | | | | 73/1.15 |
| 2016/0245667 | A1 * | 8/2016 | Najafi .................. | G01C 25/005 |
| 2016/0277847 | A1 * | 9/2016 | Joet ............................ | G01L 9/08 |
| 2016/0320426 | A1 * | 11/2016 | Boysel ............... | B81C 1/00238 |
| 2017/0188862 | A1 * | 7/2017 | Kale ...................... | A61B 5/725 |
| 2017/0355596 | A1 * | 12/2017 | Gogoi .................... | H10N 59/00 |
| 2019/0277634 | A1 * | 9/2019 | Motiee .............. | G01C 19/5712 |

OTHER PUBLICATIONS

Jeong, et al., "An Out-of-{lane "Hinge-Shaped" Nano-Gap Accelerometer With High Sensitivity and Wide Bandwidth," 2017 19th International conference on Solid-State Sensors, Actuators and Microsystems (Transducers), IEEE Jun. 18, 2017 pp. 2131-2134.
Search Report and Written Opinion from Application No. PCT/2019/024679 dated Jul. 24, 2019 (16 pages).
Search Report from EP Application No. 19788901.7 dated Apr. 17, 2024.

* cited by examiner

408

1

ACCELEROMETER CONTACT MICROPHONES AND METHODS THEREOF

CROSS-REFERENCE TO RELATED APPLICATIONS

This application is a continuation of U.S. patent application Ser. No. 17/048,816 filed 19 Oct. 2020, which is a US National Stage Application claiming priority to PCT/US2019/024679 filed 28 Mar. 2019, which claims the benefit under 35 USC § 119(e), of U.S. Provisional Patent Application No. 62/659,387, filed 18 Apr. 2018, the entire contents and substance of each being incorporated herein by reference in its entirety as if fully set forth below.

STATEMENT REGARDING FEDERALLY SPONSORED RESEARCH OR DEVELOPMENT

This invention was made with government support under Contract No. N66001-11-C-4176 awarded by Space and Naval Warfare Systems Command. The government has certain rights in the invention.

THE NAMES OF THE PARTIES TO A JOINT RESEARCH AGREEMENT

Not Applicable

SEQUENCE LISTING

Not Applicable

STATEMENT REGARDING PRIOR DISCLOSURES BY THE INVENTOR OR A JOINT INVENTOR

Not Applicable

BACKGROUND OF THE DISCLOSURE

1. Field of the Disclosure

Embodiments of the present disclosure relate generally to capacitive microelectromechanical system (MEMS) devices and, more particularly, to contact microphones. An embodiment of the invention is a vacuum-encapsulated accelerometer contact microphone (ACM) device placed on the upper torso, chest, or back area to measure the heart and lung sounds of an individual through clothing while detecting the individual's body motion.

2. Background

MEMS accelerometers have served a pivotal role in the inertial sensor industry due to their small size, low power, low production cost, and large electromechanical sensitivity. As accelerometer technologies advance, there is a growing demand to incorporate MEMS accelerometers into a variety of devices for numerous uses. Applications for MEMS accelerometers include, but are not limited to, wearable devices and health informatics. The variety of applications for the devices also produces a demand for microscale accelerometers with wide operational bandwidth and low-noise performance.

The demand for such requirements, however, directly counteracts with the conventional accelerometer design methodology. The accelerometer is a second-order system. Its bandwidth, therefore, is mostly determined by its resonant frequency, meaning that to extend the operational bandwidth, the natural frequency of the device needs to be increased. On the other hand, to achieve higher force sensitivity, devices are typically designed to have low resonant frequency. To offset this tradeoff between bandwidth and sensitivity, previous designs mainly focus on increasing the proof-mass size and reducing the device stiffness, which makes the device comparatively large, and its bandwidth limited to a few hundred Hertz.

Increased proof-mass size and a narrow bandwidth is undesirable for many applications for MEMS accelerometers. In the health informatics setting, for example, vibrations emanating from the body may be within the range of from zero Hertz to several thousand Hertz. Cardiopulmonary sounds lie between 20 Hz and 2500 Hz. Ballistocardiogram signals lie in the inaudible range of from between 0 Hz and 20 Hz. Acoustic signals emanating from the joints and bone junctions can extend to frequencies even higher than 10 kHz. Therefore, current methods having a bandwidth limited to a few hundred Hertz in a sensitive accelerometer cannot capture the entire range of vibrations emanating from a body. Additionally, and in the wearables setting in particular, increasing the proof-mass size is an undesirable solution to the bandwidth/sensitivity tradeoff. What is needed is a system that provides high sensitivity and a wide operational bandwidth and also maintains a microscale design.

BRIEF SUMMARY OF THE DISCLOSURE

Embodiments of the present disclosure address these concerns as well as other needs that will become apparent upon reading the description below in conjunction with the drawings. Briefly described, embodiments of the present disclosure relate generally to MEMS devices and, more particularly, to ACMs.

An exemplary embodiment of the present invention provides a device. A device for contact with a contact source can comprise a suspended proof mass, and a sensing electrode separated from the suspended proof mass by a sub-micron sensing gap, wherein the device is sensitive to vibrations from the contact source, wherein the device is without sensitivity to air-borne acoustic emissions, and wherein the device has out-of-plane sensitivity and micro-g resolution.

In any of the exemplary embodiments, the contact source can be a human body, and the device can be configured to capture wideband cardio- and pulmonary-induced vibrations (PIVs) from chest wall movements in an infrasonic range of from DC to 20 Hz.

In any of the exemplary embodiments, the out-of-plane sensitivity of the device can enable mounting and placement of the device onto skin of an individual as the device has unidirectional sensitivity to sounds emanating from the human body and relatively orthogonal to a surface of the skin.

In any of the exemplary embodiments, the device can be hermetically-sealed, and the suspended proof mass can operate in vacuum of smaller than or equal to 50 Torr.

In any of the exemplary embodiments, the sub-micron sensing gap can be a nano sensing gap.

In any of the exemplary embodiments, the device can have an operational bandwidth ranging from DC to 10 k Hz.

In another exemplary embodiment of the present invention, a hermetically-sealed contact microphone device comprises a suspended proof mass, and a nano-gap capacitive electrode separated from the suspended proof mass, wherein the device has out-of-plane sensitivity, and wherein the device operates in a vacuum of smaller than or equal to 50 Torr.

In any of the exemplary embodiments, the device can be sensitive to vibrations from a contact source, wherein the device can be without sensitivity to air-borne acoustic emissions, wherein the device can have micro-g resolution, wherein the device can have an operational bandwidth ranging from DC to 10 k Hz, and wherein the device can be configured to sense frequencies in both a range of from DC to 20 Hz resultant from tilt and/or motion, and a range of from 20 Hz to 10 k Hz resultant from vibration and/or acoustics.

In any of the exemplary embodiments, the device can further comprise a nano-gap capacitive damping electrode, wherein the suspended proof mass can be suspended by a supporting flexure, wherein the device can have a resonant frequency of greater than 10 k Hz, and wherein the resonant frequency of the device can be tunable via adjustment of one or more dimensions of the supporting flexure.

In any of the exemplary embodiments, the device can further comprise a substrate, wherein the supporting flexure can be attached to the substrate, wherein the first proof mass can be configured to move out-of-plane of the substrate, and wherein the device can have a vibration acceleration sensitivity of better than 10 $\mu g\sqrt{Hz}$.

In any of the exemplary embodiments, the device can comprise an out-of-plane differential accelerometer.

In another exemplary embodiment of the present invention, an out-of-plane differential accelerometer comprises a suspended proof mass and a sensing electrode separated from the suspended proof mass by a nano sensing gap, wherein the accelerometer has out-of-plane sensitivity and micro-g resolution.

In any of the exemplary embodiments, the accelerometer can be configured to sense frequencies in both a range of from DC to 20 Hz resultant from tilt and/or motion and a range of from 20 Hz to 10 k Hz resultant from vibration and/or acoustics, and wherein the accelerometer can have a resonant frequency of greater than 10 k Hz.

In any of the exemplary embodiments, the accelerometer can further comprise a torsional tether and one or more additional sensing electrodes, wherein the suspended proof mass can comprise hinged portions rotatable about the torsional tether, and wherein each sensing electrode can be separated from the hinged portions of the suspended proof mass by a nano capacitive gap, wherein the accelerometer can have an operational bandwidth ranging from DC and 10,000 Hz determined by the resonant frequency of the accelerometer, and wherein the resonant frequency of the accelerometer can be tunable via adjustment of a width of one or more of the nano capacitive gaps.

In any of the exemplary embodiments, the accelerometer can further comprise a substrate, wherein the torsional tether can be attached to the substrate, wherein the suspended proof mass can be configured to move out-of-plane of the substrate, wherein the accelerometer can be hermetically-sealed and configured to maintain a vacuum environment of smaller than or equal to 50 Torr, and wherein one or more the hinged portions of the proof mass can each be substantially thicker than the sensing electrodes, the hinged portions of the proof mass can be mirror symmetric, the accelerometer can have tri-axial vibration sensitivity including in the normal direction to the plane of the substrate and in the plane of the substrate, and/or the accelerometer can have a vibration acceleration sensitivity of better than 100 $\mu g\sqrt{Hz}$.

In another exemplary embodiment of the present invention, a contact microphone device can comprise a vacuum casing and any of the accelerometers disclosed herein contained in the vacuum casing, wherein the accelerometer can have a frequency response ranging from DC and 10,000 Hz with relatively constant sensitivity.

In any of the exemplary embodiments, the accelerometer of the contact microphone device can have a sensitivity of better than 10 $\mu g\sqrt{Hz}$.

In any of the exemplary embodiments, the accelerometer of the contact microphone device can have a sensitivity of better than 100 $\mu g\sqrt{Hz}$.

In another exemplary embodiment of the present invention, a method can comprise capturing, with any of the accelerometers disclosed herein, vibrations emanating from a person.

In any of the exemplary embodiments, the method can further comprise placing the accelerometer upon at least one of skin of the person or a fabric contacting skin of the person.

In any of the exemplary embodiments, the accelerometer can be disposed within at least one of a stethoscope, a wristwatch, a necklace, a wearable strap, a patch, or a sensor.

In another exemplary embodiment of the present invention, a method can comprise localizing sounds in a patient comprising placing two or more accelerometers upon a patient, wherein each accelerometer can comprise any of the accelerometers disclosed herein, capturing vibrations, with at least one of the accelerometers, emanating from the patient, and determining a source of the vibrations by calculating a vibration acceleration level at at least one of the accelerometers capturing vibrations.

In any of the exemplary embodiments, capturing can comprise capturing wideband cardio- and PIVs from chest wall movements in an infrasonic range of from DC to 20 Hz, and wherein the out-of-plane sensitivity of the accelerometers can enable mounting and placement of the accelerometers onto skin of the patient as the accelerometers have unidirectional sensitivity to sounds emanating from the patient and relatively orthogonal to a surface of the skin.

In any of the exemplary embodiments, one or more of the accelerometers can further comprise a substrate, a torsional tether attached to the substrate, and one or more additional sensing electrodes, wherein the suspended proof mass comprises hinged portions rotatable about the torsional tether and is configured to move out-of-plane of the substrate, wherein each sensing electrode is separated from the hinged portions of the suspended proof mass by a nano capacitive gap, wherein the hinged portions of the proof mass are each substantially thicker than the sensing electrodes, and wherein the hinged portions of the proof mass are mirror symmetric, each accelerometer has an operational bandwidth ranging from DC and 10,000 Hz determined by a tunable resonant frequency of greater than 10 k Hz of the respective accelerometer, the resonant frequency being tunable via adjustment of a width of one or more of the nano capacitive gaps. each accelerometer is hermetically-sealed and configured to maintain a vacuum environment of smaller than or equal to 50 Torr, each accelerometer is configured to sense frequencies in both: a range of from DC to 20 Hz resultant from tilt and/or motion, and a range of from 20 Hz to 10 k Hz resultant from vibration and/or acoustics, and each accelerometer has a vibration acceleration sensitivity of better than 100 $\mu g\sqrt{Hz}$.

In another exemplary embodiment of the present invention, a device comprises a first proof mass, a supporting flexure, and a first sensing electrode separated from the first proof mass by a first sensing gap, wherein the device is configured to sense frequencies in an infrasonic range of from 0 Hz to 20 Hz, wherein the device is configured to sense frequencies in an audible range of from 20 Hz to 10 k Hz, and wherein the device has a resonant frequency of greater than 10 k Hz.

In any of the exemplary embodiments, an operational bandwidth of the device can be determined by the resonant frequency of the device, and wherein the resonant frequency of the device can be tunable via adjustment of one or more dimensions of the supporting flexure.

In any of the exemplary embodiments, the device can further comprise a substrate, wherein the supporting flexure can be attached to the substrate, and wherein the first proof mass can be configured to move out-of-plane of the substrate.

In any of the exemplary embodiments, the first sensing gap can be a sub-micron capacitive gap, and wherein the first proof mass, the supporting flexure, and the first sensing electrode can be exposed to sub-atmospheric pressure.

In any of the exemplary embodiments, the infrasonic range can include frequencies resultant from tilt and/or motion, and wherein the audible range can include frequencies resultant from vibration and/or acoustics.

In any of the exemplary embodiments, the device can have a vibration acceleration sensitivity of better than 10 $\mu g \sqrt{Hz}$.

In any of the exemplary embodiments, the device can comprise an out-of-plane differential accelerometer.

In any of the exemplary embodiments, the device can further comprise a second proof mass, a second sensing electrode separated from the second proof mass by a second sensing gap, and a casing enclosing the first proof mass, the second proof mass, the first sensing electrode, the second sensing electrode, the first sensing gap, and the second sensing gap, wherein the supporting flexure can comprise a torsional tether, wherein the first proof mass and the second proof mass can form a hinged proof mass rotatable about the torsional tether, wherein each sensing gap can be a sub-micron capacitive gap, and wherein the casing can be configured to maintain an environment of smaller than or equal to 50 Torr.

In any of the exemplary embodiments, the device can further comprise a substrate, wherein the supporting flexure can be attached to the substrate, wherein the first proof mass can be configured to move out-of-plane of the substrate, and wherein one or more the device can have an operation bandwidth ranging from 0 Hz and 10,000 Hz, the first proof mass can be substantially thicker than the first sensing electrode, the device can have tri-axial vibration sensitivity including in the normal direction to the plane of the substrate and in the plane of the substrate, the device can have a sensitivity of better than 10 $\mu g \sqrt{Hz}$, and/or the device can have a sensitivity of better than 100 $\mu g \sqrt{Hz}$.

In another exemplary embodiment of the present invention, an out-of-plane differential accelerometer is configured to sense frequencies in an infrasonic range of from 0 Hz to 20 Hz and audible range of from 20 Hz to 10 k Hz, and have a resonant frequency of greater than 10 k Hz.

In any of the exemplary embodiments, the accelerometer can comprise a torsional tether, a proof mass comprising hinged portions rotatable about the torsional tether, and sensing electrodes, each separated from the hinged portions of the proof mass by a sub-micron capacitive gap, wherein the accelerometer has an operational bandwidth ranging from 0 Hz and 10,000 Hz determined by the resonant frequency of the accelerometer, and wherein the resonant frequency of the accelerometer is tunable via adjustment of a width of one or more of the sub-micron capacitive gaps.

In any of the exemplary embodiments, the accelerometer can further comprise a substrate, wherein the torsional tether can be attached to the substrate, wherein the proof mass can be configured to move out-of-plane of the substrate, and wherein one or more the accelerometer can have an operation bandwidth ranging from 0 Hz and 10,000 Hz, the hinged portions of the proof mass can each be substantially thicker than the sensing electrodes, the hinged portions of the proof mass can be mirror symmetric, and/or the accelerometer can have tri-axial vibration sensitivity including in the normal direction to the plane of the substrate and in the plane of the substrate.

In any of the exemplary embodiments, the accelerometer can have a vibration acceleration sensitivity of better than 100 $\mu g \sqrt{Hz}$.

In any of the exemplary embodiments, the accelerometer can further comprise a casing enclosing the torsional tether, the proof mass and the sensing electrodes, wherein the casing can be configured to maintain a vacuum environment of smaller than or equal to 50 Torr.

In another exemplary embodiment of the present invention, a MEMS device comprises a casing and any of the accelerometers disclosed herein contained in the casing, wherein the accelerometer has a frequency response ranging from 0 Hz and 10,000 Hz with relatively constant sensitivity.

In any of the exemplary embodiments, the accelerometer of the MEMS device can comprise a torsional tether, a proof mass comprising hinged portions rotatable about the torsional tether, and sensing electrodes, each separated from the hinged portions of the proof mass by a sub-micron capacitive gap, wherein the operational bandwidth of the accelerometer is determined by the resonant frequency of the accelerometer, and wherein the resonant frequency of the accelerometer is tunable via adjustment of a width of one or more of the sub-micron capacitive gaps.

In any of the exemplary embodiments, the casing can maintain a pressure lower than one atmosphere.

In any of the exemplary embodiments, the accelerometer can have a sensitivity of better than 10 $\mu g \sqrt{Hz}$.

In any of the exemplary embodiments, the accelerometer can have a sensitivity of better than 100 $\mu g \sqrt{Hz}$.

In another exemplary embodiment of the present invention, a method comprises capturing, with any of the accelerometers disclosed herein, vibrations emanating from a person.

In any of the exemplary embodiments, the accelerometer can comprise a torsional tether, a proof mass can comprise hinged portions rotatable about the torsional tether, and sensing electrodes, each can be separated from the hinged portions of the proof mass by a sub-micron capacitive gap, wherein the operational bandwidth of the accelerometer can be determined by the resonant frequency of the accelerometer, and wherein the resonant frequency of the accelerometer can be tunable via adjustment of a width of one or more of the sub-micron capacitive gaps.

In any of the exemplary embodiments, the method can further comprise placing the accelerometer upon at least one of skin of the person or a fabric contacting skin of the person.

In any of the exemplary embodiments, the accelerometer can be disposed within at least one of a stethoscope, a wristwatch, a necklace, a wearable strap, a patch, or a sensor.

In another exemplary embodiment of the present invention, a method of localizing sounds in a patient can comprise placing two or more accelerometers upon a patient, wherein each accelerometer can comprise any of the accelerometers disclosed herein, capturing vibrations, with at least one of the accelerometers, emanating from the patient, and determining a source of the vibrations by calculating a vibration acceleration level at at least one of the accelerometers capturing vibrations.

Another exemplary embodiment of the present invention provides a system. The system may comprise a contact microphone. The contact microphone may comprise a first proof mass, a first sensing electrode, a first sensing gap disposed between the first proof mass and the first sensing electrode, the first sensing gap being smaller than 500 nanometers, and a casing. The casing may enclose the first proof mass, the first sensing electrode, and the first sensing gap, and the casing may be configured to maintain a low-pressure environment of less than or equal to 50 Torr.

In any of the embodiments described herein, the contact microphone may comprise a second proof mass, a second sensing electrode, and a second sensing gap between the second proof mass and the second sensing electrode, the second sensing gap being smaller than 500 nanometers. The casing may enclose the second proof mass, the second sensing electrode, and the second sensing gap.

In any of the embodiments described herein, the contact microphone may have an operational bandwidth ranging from 0 Hz and 5,000 Hz with relatively constant sensitivity.

In any of the embodiments described herein, the contact microphone may have an operational bandwidth ranging from 0 Hz and 10,000 Hz with relatively constant sensitivity.

In any of the embodiments described herein, the contact microphone may have a vibration acceleration sensitivity of better than 100 μg√Hz.

In any of the embodiments described herein, the contact microphone may be a MEMS device with a proof mass that is substantially thicker than the sense electrode.

In any of the embodiments described herein, the contact microphone may comprise a substrate, and the contact microphone may have tri-axial vibration sensitivity including in the normal direction to the plane of the substrate and in the plane of the substrate.

In any of the embodiments described herein, the contact microphone may comprise a torsional tether. The first proof mass may comprise a first end and a second end. The torsional tether may be configured to support the first proof mass at the first end of the first proof mass, and the first sensing electrode may be proximate the second end of the first proof mass.

In any of the embodiments described herein, the contact microphone may comprise a second proof mass comprising a first end and a second end, a second sensing electrode, and a second sensing gap between the second proof mass and the second sensing electrode, the second sensing gap being smaller than 500 nanometers. The casing may enclose the second proof mass, the second sensing electrode, and the second sensing gap. The torsional tether may be configured to support the second proof mass at the first end of the second proof mass, and the second sensing electrode may be proximate the second end of the second proof mass.

In any of the embodiments described herein, the torsional tether may be attached to a substrate. The first proof mass may be configured to move out-of-plane of the substrate.

In any of the embodiments described herein, the torsional tether may be attached to a substrate. The first proof mass and the second proof mass may be configured to move out-of-plane of the substrate. The second proof mass may be placed mirror symmetric with respect to the first proof mass.

In any of the embodiments described herein, the first proof mass may comprise a first sensing plate. The contact microphone may further comprise a third sensing electrode and a third sensing gap disposed between the first sensing plate and the third sensing electrode, the third sensing gap being smaller than 500 nanometers. The casing may enclose the first sensing plate, the third sensing electrode, and the third sensing gap.

In any of the embodiments described herein, the contact microphone may further comprise a second proof mass comprising a second sensing plate, a second sensing electrode, and a second sensing gap between the second proof mass and the second sensing electrode, the second sensing gap being smaller than 500 nanometers. The contact microphone may further comprise a fourth sensing electrode and a fourth sensing gap disposed between the second sensing plate and the fourth sensing electrode, the fourth sensing gap being smaller than 500 nanometers. The casing may enclose the second proof mass, the second sensing electrode, the second sensing gap, the second sensing plate, the fourth sensing electrode, and the fourth sensing gap.

In any of the embodiments described herein, the first proof mass may have a length and a width, the length disposed between the first end and the second end of the first proof mass, the width perpendicular to the length. The width may be greater than the length.

In any of the embodiments described herein, the first proof mass may have a first length and a first width, the first length disposed between the first end and the second end of the first proof mass, the first width perpendicular to the first length. The first width may be greater than the first length. In any of the embodiments described herein, the second proof mass may have a second length and a second width, the second length disposed between the first end and the second end of the second proof mass, the second width perpendicular to the second length. The second width may be greater than the second length.

In any of the embodiments described herein, the contact microphone may be disposed within at least one of a stethoscope, a wristwatch, a necklace, a wearable strap, a patch, or a sensor.

Another exemplary embodiment of the present invention provides a MEMS device. The MEMS device may comprise a casing comprising an accelerometer. The accelerometer may have a frequency response ranging from 0 Hz and 10,000 Hz with relatively constant sensitivity. The accelerometer may have a sensitivity of better than 10 μg√Hz.

In any of the embodiments described herein, the casing may comprise a vacuum having a pressure substantially lower than one atmosphere.

In any of the embodiments described herein, the accelerometer may comprise a first proof mass, a first sensing electrode, and a first sensing gap disposed between the first proof mass and the first sensing electrode, the first sensing gap being smaller than 500 nanometers.

In any of the embodiments described herein, the accelerometer may comprise a second proof mass, a second sensing electrode, and a second sensing gap disposed between the second proof mass and the second sensing electrode, the second sensing gap being smaller than 500 nanometers.

In any of the embodiments described herein, the accelerometer may further comprise a substrate. The first proof mass and the second proof mass may be configured to move out-of-plane of the substrate.

In any of the embodiments described herein, the accelerometer may further comprise a first torsional tether. The first proof mass may comprise a first end and a second end. The first torsional tether may be configured to support the first proof mass at the first end of the first proof mass, and the first sensing electrode may be proximate the second end of the first proof mass.

In any of the embodiments described herein, the accelerometer may further comprise a first torsional tether. The first proof mass may comprise a first end and a second end. The first torsional tether may be configured to support the first proof mass at the first end of the first proof mass, and the first sensing electrode may be proximate the second end of the first proof mass. The second proof mass may comprise a first end and a second end. The first torsional tether may be configured to support the second proof mass at the first end of the second proof mass, and the second sensing electrode may be proximate the second end of the second proof mass.

In any of the embodiments described herein, the accelerometer may further comprise a first torsional tether and a second torsional tether. The first proof mass may comprise a first end and a second end. The first torsional tether may be configured to support the first proof mass at the first end of the first proof mass, and the first sensing electrode may be proximate the second end of the first proof mass. The second proof mass may comprise a first end and a second end. The second torsional tether may be configured to support the second proof mass at the first end of the second proof mass, and the second sensing electrode may be proximate the second end of the second proof mass.

In any of the embodiments described herein, the first proof mass may comprise a first sensing plate. The accelerometer may further comprise a third sensing electrode and a third sensing gap disposed between the first sensing plate and the third sensing electrode, the third sensing gap being smaller than 500 nanometers.

In any of the embodiments described herein, the accelerometer may further comprise a second proof mass comprising a second sensing plate, a second sensing electrode, and a second sensing gap between the second proof mass and the second sensing electrode, the second sensing gap being smaller than 500 nanometers. The accelerometer may further comprise a fourth sensing electrode and a fourth sensing gap disposed between the second sensing plate and the fourth sensing electrode, the fourth sensing gap being smaller than 500 nanometers. The casing may enclose the second proof mass, the second sensing electrode, the second sensing gap, the second sensing plate, the fourth sensing electrode, and the fourth sensing gap.

In any of the embodiments described herein, the accelerometer may be a contact microphone.

In any of the embodiments described herein, the contact microphone may be disposed within at least one of a stethoscope, a wristwatch, a necklace, a wearable strap, a patch, or a sensor.

Another exemplary embodiment of the present invention provides a method. The method may comprise providing an accelerometer. The accelerometer may comprise a first proof mass, a first sensing electrode, a first sensing gap disposed between the first proof mass and the first sensing electrode, the first sensing gap being smaller than 500 nanometers, and a casing. The casing may enclose the first proof mass, the first sensing electrode, and the first sensing gap, and the casing may be configured to maintain a low-pressure environment of less than or equal to 50 Torr. The method may further comprise placing the accelerometer upon a person. The method may further comprise capturing vibrations, with the accelerometer, emanating from the person.

In any of the embodiments described herein, the accelerometer may comprise a second proof mass, a second sensing electrode, and a second sensing gap between the second proof mass and the second sensing electrode, the second sensing gap being smaller than 500 nanometers. The casing may enclose the second proof mass, the second sensing electrode, and the second sensing gap.

In any of the embodiments described herein, the accelerometer may have an operational bandwidth ranging from 0 Hz and 5,000 Hz with relatively constant sensitivity.

In any of the embodiments described herein, the accelerometer may have an operational bandwidth ranging from 0 Hz and 10,000 Hz with relatively constant sensitivity.

In any of the embodiments described herein, the accelerometer may have a vibration acceleration sensitivity of better than 100 $\mu g \sqrt{Hz}$.

In any of the embodiments described herein, the accelerometer may comprise a torsional tether. The first proof mass may comprise a first end and a second end. The torsional tether may be configured to support the first proof mass at the first end of the first proof mass, and the first sensing electrode may be proximate the second end of the first proof mass.

In any of the embodiments described herein, the accelerometer may comprise a second proof mass comprising a first end and a second end, a second sensing electrode, and a second sensing gap between the second proof mass and the second sensing electrode, the second sensing gap being smaller than 500 nanometers. The casing may enclose the second proof mass, the second sensing electrode, and the second sensing gap. The torsional tether may be configured to support the second proof mass at the first end of the second proof mass, and the second sensing electrode may be proximate the second end of the second proof mass.

In any of the embodiments described herein, the torsional tether may be attached to a substrate. The first proof mass may be configured to move out-of-plane of the substrate.

In any of the embodiments described herein, the torsional tether may be attached to a substrate. The first proof mass and the second proof mass may be configured to move out-of-plane of the substrate.

In any of the embodiments described herein, the first proof mass may comprise a first sensing plate. The accelerometer may further comprise a third sensing electrode and a third sensing gap disposed between the first sensing plate and the third sensing electrode, the third sensing gap being smaller than 500 nanometers. The casing may enclose the first sensing plate, the third sensing electrode, and the third sensing gap.

In any of the embodiments described herein, the accelerometer may further comprise a second proof mass comprising a second sensing plate, a second sensing electrode, and a second sensing gap between the second proof mass and the second sensing electrode, the second sensing gap being smaller than 500 nanometers. The accelerometer may further comprise a fourth sensing electrode and a fourth sensing gap disposed between the second sensing plate and the fourth sensing electrode, the fourth sensing gap being smaller than 500 nanometers. The casing may enclose the second proof mass, the second sensing electrode, the second sensing gap, the second sensing plate, the fourth sensing electrode, and the fourth sensing gap.

In any of the embodiments described herein, the first proof mass may have a length and a width, the length disposed between the first end and the second end of the first proof mass, the width perpendicular to the length. The width may be greater than the length.

In any of the embodiments described herein, the first proof mass may have a first length and a first width, the first length disposed between the first end and the second end of the first proof mass, the first width perpendicular to the first length. The first width may be greater than the first length. In any of the embodiments described herein, the second proof mass may have a second length and a second width, the second length disposed between the first end and the second end of the second proof mass, the second width perpendicular to the second length. The second width may be greater than the second length.

In any of the embodiments described herein, the accelerometer may be a contact microphone.

In any of the embodiments described herein, the contact microphone may be disposed within at least one of a stethoscope, a wristwatch, a necklace, a wearable strap, a patch, or a sensor.

In any of the embodiments described herein, placing the accelerometer upon a person may comprise placing the accelerometer upon at least one of skin or a fabric contacting skin.

In any of the embodiments described herein, placing the accelerometer upon a person may comprise placing the accelerometer at an intercostal space.

In any of the embodiments described herein, placing the accelerometer upon a person may comprise placing the accelerometer at a joint space.

In any of the embodiments described herein, the vibrations emanating from a person may be caused by cardiopulmonary sounds.

In any of the embodiments described herein, the vibrations emanating from a person may be caused by heart sounds.

In any of the embodiments described herein, the vibrations emanating from a person may be caused by lung sounds.

In any of the embodiments described herein, the vibrations emanating from a person may be caused by ballistocardiogram signals.

In any of the embodiments described herein, the vibrations emanating from a person may be caused by joint sounds.

Another exemplary embodiment of the present invention provides a method. The method may comprise providing an accelerometer. The accelerometer may have an operational bandwidth ranging from 0 Hz and 10,000 Hz. The accelerometer may have a vibration acceleration sensitivity of better than 100 $\mu g \sqrt{Hz}$.

In any of the embodiments described herein, the accelerometer may comprise a first proof mass, a first sensing electrode, and a first sensing gap disposed between the first proof mass and the first sensing electrode, the first sensing gap being smaller than 500 nanometers.

In any of the embodiments described herein, the accelerometer may comprise a second proof mass, a second sensing electrode, and a second sensing gap disposed between the second proof mass and the second sensing electrode, the second sensing gap being smaller than 500 nanometers.

In any of the embodiments described herein, the accelerometer may further comprise a substrate. The first proof mass and the second proof mass may be configured to move out-of-plane of the substrate.

In any of the embodiments described herein, the accelerometer may further comprise a first torsional tether. The first proof mass may comprise a first end and a second end. The first torsional tether may be configured to support the first proof mass at the first end of the first proof mass, and the first sensing electrode may be proximate the second end of the first proof mass.

In any of the embodiments described herein, the accelerometer may further comprise a first torsional tether. The first proof mass may comprise a first end and a second end. The first torsional tether may be configured to support the first proof mass at the first end of the first proof mass, and the first sensing electrode may be proximate the second end of the first proof mass. The second proof mass may comprise a first end and a second end. The first torsional tether may be configured to support the second proof mass at the first end of the second proof mass, and the second sensing electrode may be proximate the second end of the second proof mass.

In any of the embodiments described herein, the accelerometer may further comprise a first torsional tether and a second torsional tether. The first proof mass may comprise a first end and a second end. The first torsional tether may be configured to support the first proof mass at the first end of the first proof mass, and the first sensing electrode may be proximate the second end of the first proof mass. The second proof mass may comprise a first end and a second end. The second torsional tether may be configured to support the second proof mass at the first end of the second proof mass, and the second sensing electrode may be proximate the second end of the second proof mass.

In any of the embodiments described herein, the first proof mass may comprise a first sensing plate. The accelerometer may further comprise a third sensing electrode and a third sensing gap disposed between the first sensing plate and the third sensing electrode, the third sensing gap being smaller than 500 nanometers.

In any of the embodiments described herein, the accelerometer may further comprise a second proof mass comprising a second sensing plate, a second sensing electrode, and a second sensing gap between the second proof mass and the second sensing electrode, the second sensing gap being smaller than 500 nanometers. The accelerometer may further comprise a fourth sensing electrode and a fourth sensing gap disposed between the second sensing plate and the fourth sensing electrode, the fourth sensing gap being smaller than 500 nanometers. The casing may enclose the second proof mass, the second sensing electrode, the second sensing gap, the second sensing plate, the fourth sensing electrode, and the fourth sensing gap.

In any of the embodiments described herein, the accelerometer may be a contact microphone.

In any of the embodiments described herein, the contact microphone may be disposed within at least one of a stethoscope, a wristwatch, a necklace, a wearable strap, a patch, or a sensor.

In any of the embodiments described herein, placing the accelerometer upon a person may comprise placing the accelerometer upon at least one of skin or a fabric contacting skin.

In any of the embodiments described herein, placing the accelerometer upon a person may comprise placing the accelerometer at an intercostal space.

In any of the embodiments described herein, placing the accelerometer upon a person may comprise placing the accelerometer at a joint space.

In any of the embodiments described herein, the vibrations emanating from a person may be caused by cardiopulmonary sounds.

In any of the embodiments described herein, the vibrations emanating from a person may be caused by heart sounds.

In any of the embodiments described herein, the vibrations emanating from a person may be caused by lung sounds.

In any of the embodiments described herein, the vibrations emanating from a person may be caused by ballistocardiogram signals.

In any of the embodiments described herein, the vibrations emanating from a person may be caused by joint sounds.

Another exemplary embodiment of the present invention provides a method. The method may comprise providing a plurality of accelerometers. Each accelerometer may have an operational bandwidth ranging from 0 Hz and 10,000 Hz. Each accelerometer may have a vibration acceleration sensitivity of better than 100 μg√Hz. The method may further comprise placing each accelerometer upon a person. The method may further comprise capturing vibrations, with each accelerometer, emanating from the person. The method may further comprise determining a source of the vibrations by calculating a vibration acceleration level at each of the accelerometers.

In any of the embodiments described herein, each accelerometer may comprise a first proof mass, a first sensing electrode, and a first sensing gap disposed between the first proof mass and the first sensing electrode, the first sensing gap being smaller than 500 nanometers.

In any of the embodiments described herein, each accelerometer may comprise a second proof mass, a second sensing electrode, and a second sensing gap disposed between the second proof mass and the second sensing electrode, the second sensing gap being smaller than 500 nanometers.

In any of the embodiments described herein, each accelerometer may further comprise a substrate. The first proof mass and the second proof mass may be configured to move out-of-plane of the substrate.

In any of the embodiments described herein, each accelerometer may further comprise a first torsional tether. The first proof mass may comprise a first end and a second end. The first torsional tether may be configured to support the first proof mass at the first end of the first proof mass, and the first sensing electrode may be proximate the second end of the first proof mass.

In any of the embodiments described herein, each accelerometer may further comprise a first torsional tether. The first proof mass may comprise a first end and a second end. The first torsional tether may be configured to support the first proof mass at the first end of the first proof mass, and the first sensing electrode may be proximate the second end of the first proof mass. The second proof mass may comprise a first end and a second end. The first torsional tether may be configured to support the second proof mass at the first end of the second proof mass, and the second sensing electrode may be proximate the second end of the second proof mass.

In any of the embodiments described herein, each accelerometer may further comprise a first torsional tether and a second torsional tether. The first proof mass may comprise a first end and a second end. The first torsional tether may be configured to support the first proof mass at the first end of the first proof mass, and the first sensing electrode may be proximate the second end of the first proof mass. The second proof mass may comprise a first end and a second end. The second torsional tether may be configured to support the second proof mass at the first end of the second proof mass, and the second sensing electrode may be proximate the second end of the second proof mass.

In any of the embodiments described herein, the first proof mass may comprise a first sensing plate. Each accelerometer may further comprise a third sensing electrode and a third sensing gap disposed between the first sensing plate and the third sensing electrode, the third sensing gap being smaller than 500 nanometers.

In any of the embodiments described herein, each accelerometer may further comprise a second proof mass comprising a second sensing plate, a second sensing electrode, and a second sensing gap between the second proof mass and the second sensing electrode, the second sensing gap being smaller than 500 nanometers. Each accelerometer may further comprise a fourth sensing electrode and a fourth sensing gap disposed between the second sensing plate and the fourth sensing electrode, the fourth sensing gap being smaller than 500 nanometers. The casing may enclose the second proof mass, the second sensing electrode, the second sensing gap, the second sensing plate, the fourth sensing electrode, and the fourth sensing gap.

In any of the embodiments described herein, each accelerometer may be a contact microphone.

In any of the embodiments described herein, each contact microphone may be disposed within at least one of a stethoscope, a wristwatch, a necklace, a wearable strap, a patch, or a sensor.

In any of the embodiments described herein, placing each accelerometer upon a person may comprise placing the accelerometer upon at least one of skin or a fabric contacting skin.

In any of the embodiments described herein, placing each accelerometer upon a person may comprise placing the accelerometer at an intercostal space.

In any of the embodiments described herein, placing each accelerometer upon a person may comprise placing the accelerometer at a joint space.

In any of the embodiments described herein, the vibrations emanating from a person may be caused by cardiopulmonary sounds.

In any of the embodiments described herein, the vibrations emanating from a person may be caused by heart sounds.

In any of the embodiments described herein, the vibrations emanating from a person may be caused by lung sounds.

In any of the embodiments described herein, the vibrations emanating from a person may be caused by ballistocardiogram signals.

In any of the embodiments described herein, the vibrations emanating from a person may be caused by joint sounds.

In any of the embodiments described herein, the method may comprise providing three accelerometers, and determining a source of the vibrations may comprise triangulating the source of the vibrations.

In another exemplary embodiment of the present invention, a device comprises a hermetically-sealed MEMS device that can capture wideband cardio- and PIVs from chest wall movements, from DC to 10 kHz without sensitivity to external airborne sounds. The MEMS sensor cab be based on a wideband accelerometer with out-of-plane sensitivity and micro-g resolution made from a suspended silicon membrane operating in vacuum employing differential nano-gap capacitive transducers.

A MEMS chip can be interfaced with a custom high bandwidth, low noise complementary metal-oxide-semiconductor (CMOS) application specific integrated circuit (ASIC) for converting the MEMS capacitive output to a 24 bit digital signal. The velocity random walk (VRW), which is a representation of the thermal noise in the system, is measured to be typically around 6 μg/√Hz for the MEMS+

ASIC configuration. The sensor can be very thin (only a few 100 micrometer in thickness) and be mounted on a board to form a small patch, and placed on the chest wall, front or back of the chest.

The device can, in essence, be a contact microphone able to capture key abnormal respiratory sounds, such as wheezes, crackles as well as heart sounds from patients with high fidelity, with the recordings unaffected by environmental airborne acoustic noise. This is in patentable contrast with using a regular microphone, as the recordings of a regular microphone gets affected by background noise (such as noise speech of someone like a doctor, or emergency/ hospital room noise, etc.). The present device need not have an acoustic port to access the air pressure fluctuations that a regular airborne microphone senses and measures, i.e., it is hermetically sealed.

As such, the present device need not respond to any ambient sounds and can be used reliably in noisy environments such as hospitals to monitor the mechano-acoustic lung functions, including the breathing pattern below 20 Hz near DC. The current system can interface with a data acquisition hub board that can take input from up to, for example, 12 small sensor heads. The contact microphone chip can be a wideband vibrometer operating in the DC to 10 k Hz range with constant gain, developed based on advanced MEMS technology that enables nanoscale capacitive gaps in a hermetically-sealed device operating in vacuum.

The present system can comprise a multi-head sensor version to detect PIV or heart and lung sounds from multiple locations of the chest, front and back side.

In an exemplary device, the proof mass is suspended. A minimum acceptable bandwidth of the device can be 2 k Hz. A combination of nano-gap capacitive electrodes, nano-gap capacitive damping electrodes, out-of-plane sensitivity, and vacuum packaging in a hermetically sealed cavity provide an inventive contribution over the prior art.

These and other aspects of the present disclosure are described in the Detailed Description below and the accompanying figures. Other aspects and features of embodiments of the present disclosure will become apparent to those of ordinary skill in the art upon reviewing the following description of specific, example embodiments of the present disclosure in concert with the figures. While features of the present disclosure may be discussed relative to certain embodiments and figures, all embodiments of the present disclosure can include one or more of the features discussed herein. Further, while one or more embodiments may be discussed as having certain advantageous features, one or more of such features may also be used with the various embodiments of the disclosure discussed herein. In similar fashion, while example embodiments may be discussed below as device, system, or method embodiments, it is to be understood that such example embodiments can be implemented in various devices, systems, and methods of the present disclosure.

BRIEF DESCRIPTION OF THE DRAWINGS

The accompanying drawings, which are incorporated in and constitute a part of this specification, illustrate multiple embodiments of the presently disclosed subject matter and serve to explain the principles of the presently disclosed subject matter. The drawings are not intended to limit the scope of the presently disclosed subject matter in any manner.

DETAILED DESCRIPTION

Figure 1A:
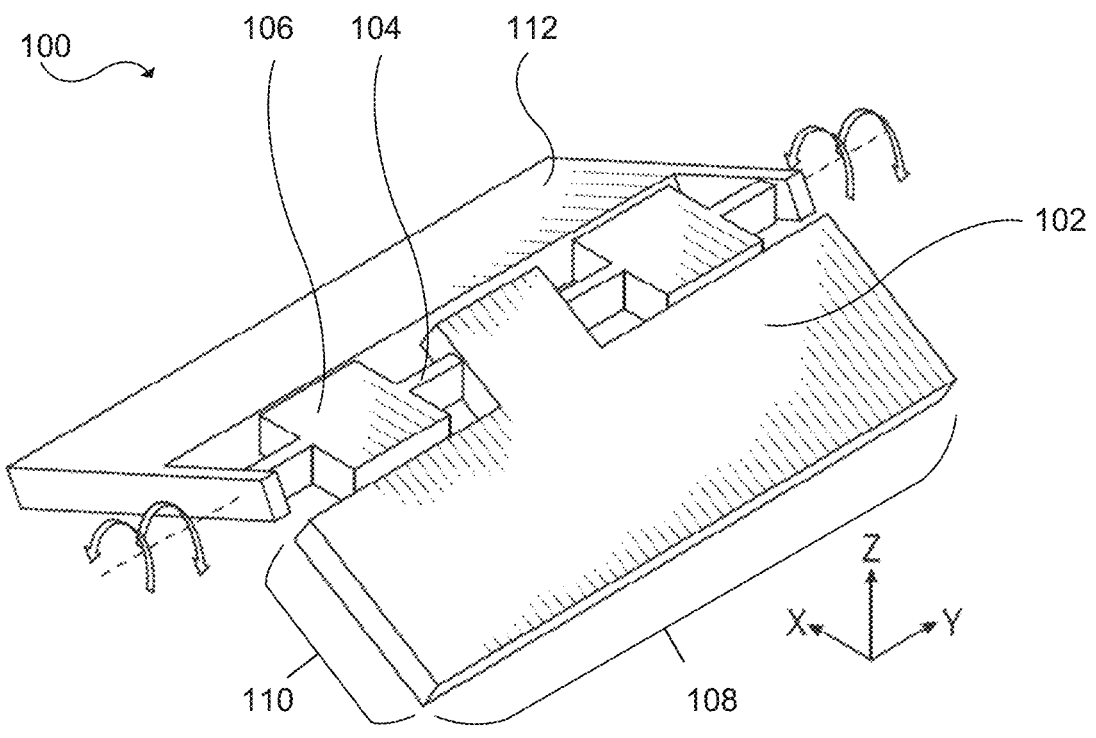
FIG. 1A is a perspective view of an exemplary out-of-plane accelerometer, according to an exemplary embodiment of the present invention.

Although certain embodiments of the disclosure are explained in detail, it is to be understood that other embodiments are contemplated. Accordingly, it is not intended that the disclosure is limited in its scope to the details of construction and arrangement of components set forth in the following description or illustrated in the drawings. Other embodiments of the disclosure are capable of being practiced or carried out in various ways. Also, in describing the embodiments, specific terminology will be resorted to for the sake of clarity. It is intended that each term contemplates its broadest meaning as understood by those skilled in the art and includes all technical equivalents which operate in a similar manner to accomplish a similar purpose.

It should also be noted that, as used in the specification and the appended claims, the singular forms "a," "an" and "the" include plural references unless the context clearly dictates otherwise. References to a composition containing "a" constituent is intended to include other constituents in addition to the one named.

Ranges may be expressed herein as from "about" or "approximately" or "substantially" one particular value and/or to "about" or "approximately" or "substantially" another particular value. When such a range is expressed, other exemplary embodiments include from the one particular value and/or to the other particular value.

Herein, the use of terms such as "having," "has," "including," or "includes" are open-ended and are intended to have the same meaning as terms such as "comprising" or "comprises" and not preclude the presence of other structure, material, or acts. Similarly, though the use of terms such as "can" or "may" are intended to be open-ended and to reflect that structure, material, or acts are not necessary, the failure to use such terms is not intended to reflect that structure, material, or acts are essential. To the extent that structure, material, or acts are presently considered to be essential, they are identified as such.

It is also to be understood that the mention of one or more method steps does not preclude the presence of additional method steps or intervening method steps between those steps expressly identified. Moreover, although the term "step" may be used herein to connote different aspects of methods employed, the term should not be interpreted as implying any particular order among or between various steps herein disclosed unless and except when the order of individual steps is explicitly required.

The components described hereinafter as making up various elements of the disclosure are intended to be illustrative and not restrictive. Many suitable components that would perform the same or similar functions as the components described herein are intended to be embraced within the scope of the disclosure. Such other components not described herein can include, but are not limited to, for example, similar components that are developed after development of the presently disclosed subject matter. Additionally, the components described herein may apply to any other component within the disclosure. Merely discussing a feature or component in relation to one embodiment does not preclude the feature or component from being used or associated with another embodiment.

To facilitate an understanding of the principles and features of the disclosure, various illustrative embodiments are explained below. In particular, the presently disclosed subject matter is described in the context of accelerometers and ACMs that are meant to measure direct mechanical vibrations applied to its casing. Various embodiments are discussed herein in the context of comprising accelerometers, contact microphones, and/or ACMs. Unless otherwise indicated, the various embodiments described herein may apply to any of these devices. For example, if an example is discussed in the context of being an accelerometer, the embodiment alternatively can apply in the context of a contact microphone or ACM. The present disclosure, however, is not so limited and can be applicable in other contexts. For example, and not limitation, some embodiments of the present disclosure may improve the functionality of other sensing devices, including but not limited to gyroscopes. Some embodiments of the present disclosure may improve the functionality of other electromechanical systems, including but not limited to resonators. Also, embodiments of the present disclosure are not limited to any particular setting. Healthcare settings, for example, are described herein. The systems and methods described herein are contemplated for use in any setting where accelerometers and/or ACMs can be used. These embodiments are contemplated within the scope of the present disclosure. Accordingly, when the present disclosure is described in the context of an ACM, it will be understood that other embodiments can take the place of those referred to.

As described above, capacitive MEMS accelerometers have served a pivotal role in the inertial sensor industry due to their small size, low power, low production cost, and large electromechanical sensitivity. As the technology advances, there is a growing demand from newly emerging applications for these devices, for use in wearables and health informatics for example. In some embodiments, accelerometers may be used as contact microphones, or devices that capture acoustic vibrations (or accelerations). As will be described herein, to capture high-quality audio signals (i.e., accelerations caused by the sound source) using an accelerometer as a contact microphone, small MEMS accelerometers with wide operational bandwidth and micro-g resolution are needed. Each of these potential uses can benefit from microscale accelerometers having a wide operational bandwidth (ranging from between 0 Hz and 10,000 Hz, for example) and low-noise performance (sub-100 $\mu g\sqrt{Hz}$ vibration acceleration sensitivity, for example). Other examples of applications that can benefit from a contact microphone with wide operational bandwidth include but are not limited to monitoring equipment condition and the health of machinery in industrial settings, active noise cancellation, detection of friction and/or sliding forces between two surfaces, or between a stylus and a surface.

Such requirements, however, directly counteract with conventional accelerometer designs. As the accelerometer is a second-order system, its bandwidth is mostly determined by its resonant frequency, meaning that to extend the operational bandwidth, the natural frequency of the device must be increased. To achieve a higher force sensitivity, previous devices were designed to have low resonant frequency. Accordingly, this is why many previous micro-g ($\mu g$) accelerometers focused on increasing the proof-mass size and reducing the stiffness of the device. This combination results in a large accelerometer having a bandwidth limited to a few hundred Hertz.

Additionally, and in the wearables setting in particular, having a miniature ACM with unidirectional sensitivity to sounds emanating from the body and relatively orthogonal to the surface of the skin (i.e., a so-called out-of-plane sensitivity) is very important, as it enables easy mounting and placement of the device die on its larger surface onto the skin of an individual. Such a device will not show much sensitivity to the undesirable sounds due to friction of the device die on the skin or the clothing as those vibrations are primarily in the plane of the substrate. Moreover, a very small hermetically-encapsulated sensor die may be desirable to enable a small wearable solution using a flexible patch. The smaller the sensor die, the better it may fit into a small, flexible patch as the curvature of a body will not affect the performance of the device. In such an embodiment, wafer level packaging (WLP) of the device may help reduce the overall size of the encapsulated sensor while enabling thinning of the die for use in ultra-thin solutions. What is needed is a robust system that provides high vibration sensitivity and a wide operational bandwidth and also maintains a thin micro-scale design. Such a system could ideally work through clothing. The use of a three-axis ACM with vibration sensitivities along X, Y and Z axes (two orthogonal in-plane directions and the out of plane direction) would also be beneficial as it allows for detection of body motion and differentiation from undesirable sounds emanating from the friction of sensor die and skin or clothing.

Embodiments of the present disclosure provide an integrated single-chip solution addressing all the aforementioned features. An exemplary embodiment of the present disclosure presents an out-of-plane accelerometer having a teeter-totter topology. In these designs, an imbalance of a proof mass with respect to a torsional tether creates a torque $\tau$ when an external acceleration is applied to the accelerometer. This allows the microstructure to rotate at an angle $\theta$. The relationship is expressed by $$\theta = \frac{\tau}{K_\theta} = \frac{F_{applied} \cdot r}{K_\theta} = \frac{M \cdot r}{K_\theta} \cdot \vec{a}_{applied} \qquad \text{Equation 1}$$

Here, $K_\theta$, M, r are the rotational stiffness, proof mass, and the distance between torsional beam and center-of-mass, respectively. As can be seen, the longer the proof-mass length from the torsional tether (i.e., r), the higher the generated torque and thus the higher the sensitivity.

Providing a longer proof mass from the torsional tether, however, also raises the possibility of stiction due to the capillary force of the wet etchant. The capillary force can be expressed by $$F_{capillary} = \frac{2A\gamma_{la} \cos \theta_c}{d} \qquad \text{Equation 2}$$

Here, A is the wetted area, $\gamma_{la}$ is the surface tension of the liquid-air surface, $\theta_c$ is the contact angle of the liquid at interface, and d is the distance between two microstructures. During the device release process, liquid etchant (e.g., hydrofluoric acid (HF)) that is present at the out-of-plane sensing electrodes can generate a capillary force, which attracts the suspended proof-mass toward the fixed electrode. As the sensing electrodes are also located at a certain distance from the torsional tether to maximize the capacitive sensitivity, generated torque due to the stiction force can be considerable and can cause a stiction failure if the torque is too excessive. Because of these fabrication-related issues, the length L of the proof-mass from the torsional support beam cannot be increased by a large amount or else the performance of the teeter-totter topology becomes limited.

Embodiments of the present disclosure relate generally to MEMS devices and, more particularly, to ACMs. Embodiments of the present disclosure provide novel solutions to the limitations of current devices, and in some embodiments, provide devices having a teeter-totter topology. As will be described herein, these novel solutions may include, but are not limited to, providing nanometer or deep sub-micron sensing gaps to increase capacitive sensitivity, providing a vacuum environment for the accelerometer, providing a differential sensing mechanism, and/or any combination thereof.

Various devices and methods are disclosed for providing accelerometers and ACMs, and exemplary embodiments of the devices and methods will now be described with reference to the accompanying figures.

Figure 1B:
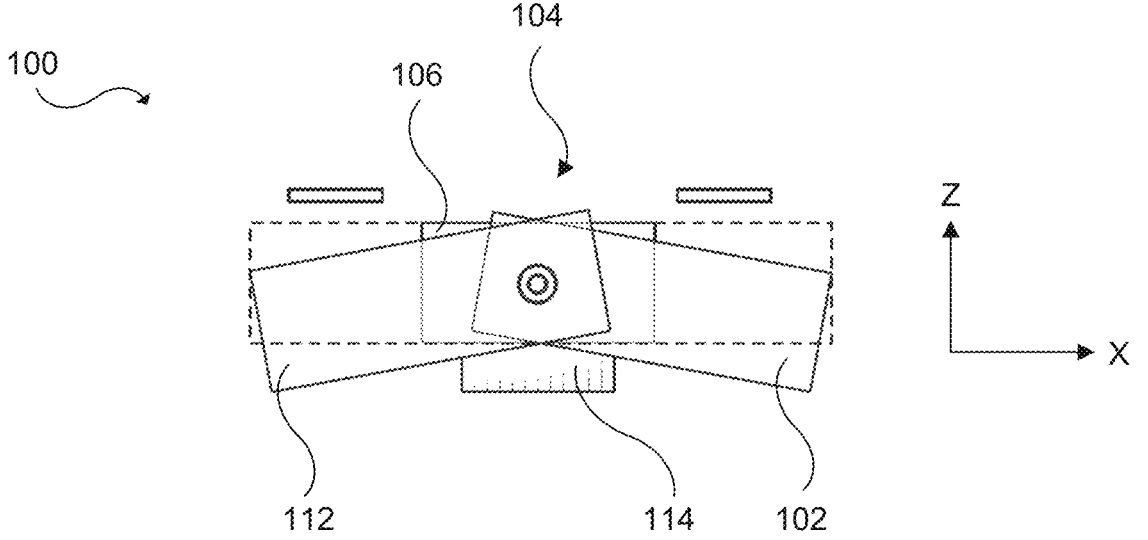
FIG. 1B is a side perspective view of the exemplary out-of-plane accelerometer, according to an exemplary embodiment of the present invention.

FIGS. 1A and 1B are schematics of a hinge-shaped, out-of-plane accelerometer 100, according to an exemplary embodiment of the present disclosure. FIG. 1A is a perspective view of an exemplary out-of-plane accelerometer 100. An out-of-plane accelerometer 100 can have a first proof mass 102. In some embodiments, the first proof mass 102 may be supported by a torsional tether 104. A torsional tether 104 may be connected to the fixed substrate layer of the accelerometer 100 at a center support 106. As can be seen in the exemplary accelerometer 100, some embodiments of the present disclosure may comprise a proof-mass width W 108 that is larger than its length L 110 (W>L). Compared with conventional torsional designs, the generated torque due to the capillary force may be lower in embodiments having a proof-mass width 108 larger than the length 110, as is described above and in Equations 1 and 2.

In some embodiments, the rotational stiffness $K_\theta$ of the torsional tether 104 may be altered based on the following relationship $$K_\theta = \frac{4\alpha GH_{thk} W_b^3}{L_b} \qquad \text{Equation 3}$$

Here, $\alpha$, G, $H_{thk}$, $W_b$, and $L_b$ represent the correction factor, shear modulus, device thickness, tether 104 width, and tether 104 length, respectively. As can be seen in the equation, the stiffness of a torsional tether 104 may be increased by increasing the thickness of the substrate of the accelerometer 100 (substrate shown in FIG. 1B).

Referring again to FIG. 1A, an out-of-plane accelerometer 100 may have a second proof mass 112. In these embodiments, the second proof mass 112 may be connected to the substrate layer of the out-of-plane accelerometer 100 at a center support 106. In any embodiment described herein with a first proof mass 102 and a second proof mass 112, each proof mass 102, 112 may comprise similar features, e.g., similar dimensions or similar additional features such as electrodes and/or sensing plates. Nothing, however, requires a second proof mass 112 to comprise the same characteristics of a first proof mass 102. For example, and not limitation, a length, thickness, and/or width of a second proof mass 112 may vary from the first proof mass 102. In these embodiments, each proof mass 102, 112 may be independently altered based on the characteristics described above in Equations 1 and 2. In some embodiments, and as will be described herein, a proof mass 102, 112 may comprise additional features, for example electrodes and sensing plates, and in some embodiments the additional features of one proof mass 102, 112 may vary from the additional features of another proof mass 112, 102.

FIG. 1B is a side perspective view of the exemplary out-of-plane accelerometer 100 shown in FIG. 1A, according to an exemplary embodiment of the present disclosure. FIG. 1B depicts a schematic diagram of an exemplary accelerometer movement under acceleration. As can be seen in the exemplary schematic of FIG. 1B, an out-of-plane accelerometer 100 may comprise a torsional tether 104 that connects a first proof mass 102 to the device's fixed substrate 114. In some embodiments, a torsional tether 104 may connect a second proof mass 112 to the device's fixed substrate 114. In embodiments with a hinge shape, as seen in FIG. 1B, a first proof mass can move out-of-plane with the substrate 114. For example, the substrate shown may continue along the X- and Y-axis to create a handle layer for the accelerometer 100. A proof mass 102, 112 may actuate, or move, in a plane separate from the substrate 114, i.e., in a plane above or below the substrate 114. Additionally, as can be seen in the figure, the teeter-totter topology also allows a proof mass 102, 112 to actuate along the Z-axis. Accordingly, some embodiments of the proposed design may be beneficial to navigation systems tracking movement in a space, which is in addition to the use of the devices described herein as an ACM.

Figure 2:
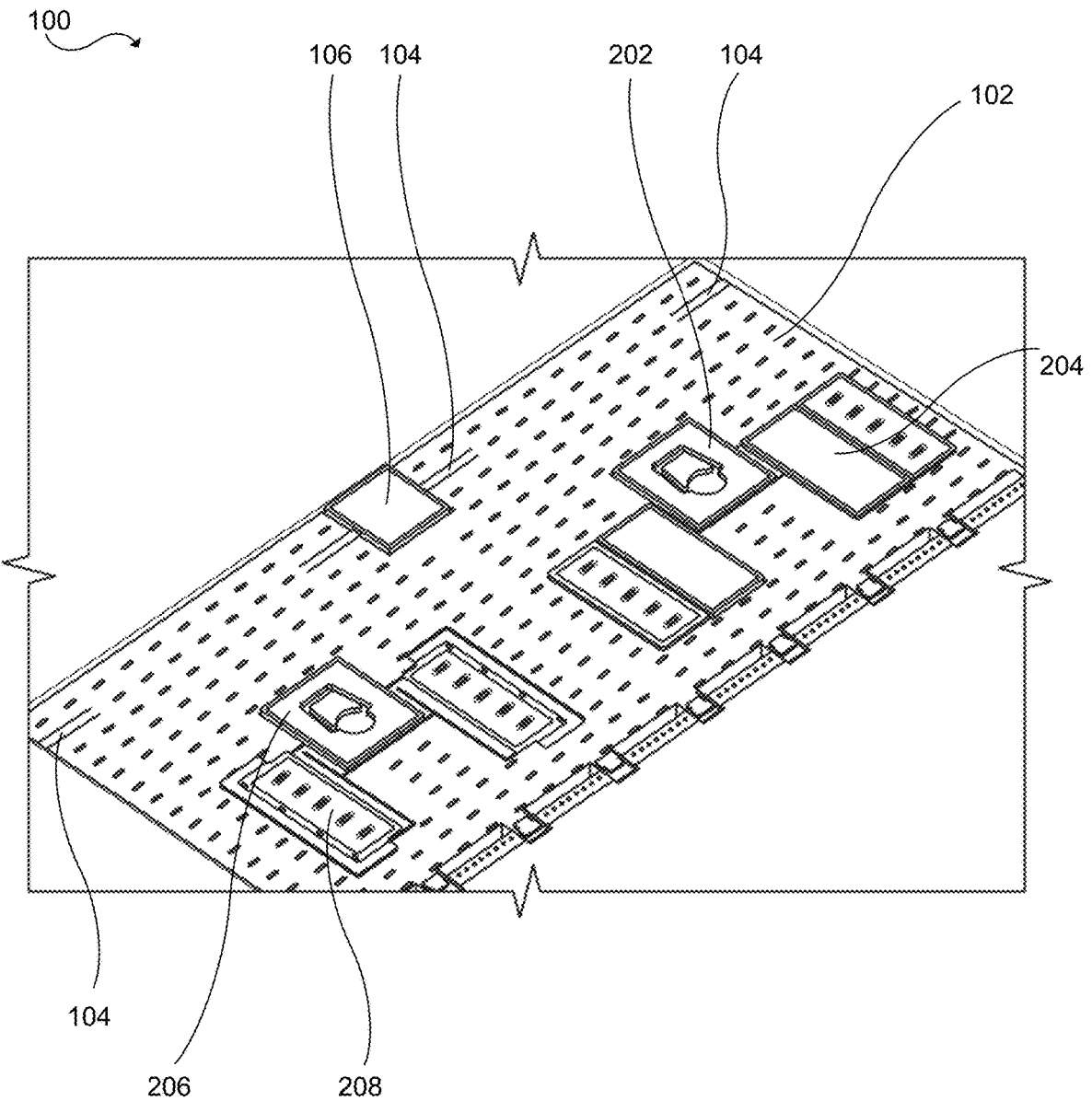
FIG. 2 is a perspective view of an exemplary out-of-plane accelerometer having a proof mass, a torsional tether, and a center support, according to an exemplary embodiment of the present invention.

FIG. 2 is a perspective view of an exemplary out-of-plane accelerometer 100 having a proof mass 102, a torsional tether 104, and a center support 106, according to an exemplary embodiment of the present disclosure. In some embodiments, an out-of-plane accelerometer 100 may comprise a single proof mass 102 attached to a substrate by a torsional tether 104. The torsional tether 104 may connect the proof mass 102 to the substrate at a center support 106 and/or along the sides of a proof mass (as shown in FIG. 2). In such an embodiment, the end of the proof mass 102 proximate the torsional tether 104 does not actuate as a result of acceleration, the end of the proof mass 102 distal to the torsional tether 104 may actuate as a result of acceleration.

In some embodiments, an out-of-plane accelerometer 100 may comprise a first sensing electrode 202. The first sensing electrode 202 may be connecting to the underlying substrate. In some embodiments, a sensing plate 204 of the first sensing electrode 202 may be attached to the first sensing electrode 202. The sensing plate 204 may extend along the surface of the proof mass 102 so as to capture the accelerations of the proof mass 102 (i.e., to capture the change in a capacitive gap between the proof mass 102 and the sensing plate 204, as will be discussed herein).

In some embodiments, an out-of-plane accelerometer 100 may comprise a second sensing electrode 206. The second sensing electrode 206 may be connected to the underlying substrate. In some embodiments, a sensing plate 208 may be positioned upon a proof mass 102. The sensing plate 208 may extend from the proof mass 102 and cover, at least partially, the second sensing electrode 206.

In some embodiments, an out-of-plane accelerometer 100 may comprise a first sensing electrode 202 (wherein the sensing plate 204 is attached to the fixed electrode 202) and a second sensing electrode 206 (wherein the sensing plate 208 is attached to the proof mass 102). In these embodiments, when an acceleration is applied to the accelerometer 100 toward the out-of-plane direction, a capacitive gap between the first sensing electrode 202 and the proof mass 102 may increase while a capacitive gap between the second sensing electrode 206 and the sensing plate 208 (attached to the proof mass 102) may decrease. This creates a differential capacitance change. In some embodiments, a dual proof-mass topology (e.g., a first proof mass 102 and a second proof mass 112) may also be used to double the capacitive sensitivity of the accelerometer 100. The use of nanometer scale gaps may be needed to increase the bandwidth of the accelerometer while preserving a high electromechanical sensitivity for the device. The small gap may cause a large squeeze film damping between the electrode and the proof mass, if the device operates at atmospheric pressure, which may degrade the noise and the bandwidth of the device. As such, in some embodiments the device operates in vacuum to reduce squeeze film damping. Depending on the vacuum level, the gap size and the overall electrode area can be adjusted to reach at a desirable damping factor for the device. In some cases, damping electrodes that are at the same electrical potential as the proof mass may be used to provide additional damping.

The exemplary out-of-plane accelerometer 100 in FIG. 2 depicts an uncapped out-of-plane accelerometer 100, which is in accordance with some embodiments. In some embodiments, the features of the out-of-plane accelerometer 100 may be capped within a casing. A casing may provide an environment to maintain a vacuum level. It is contemplated that the vacuum pressure within the casing may be substantially lower than one atmosphere. In some embodiments, the vacuum pressure may be less than or equal to 100 Torr, the vacuum pressure may be less than or equal to 50 Torr, the vacuum pressure may be less than or equal to 10 Torr. In some embodiments, an out-of-plane accelerometer 100 may comprise additional damping electrodes, which in some embodiments may assist stable operation under low-pressure environment.

Figures 3A, 3B:
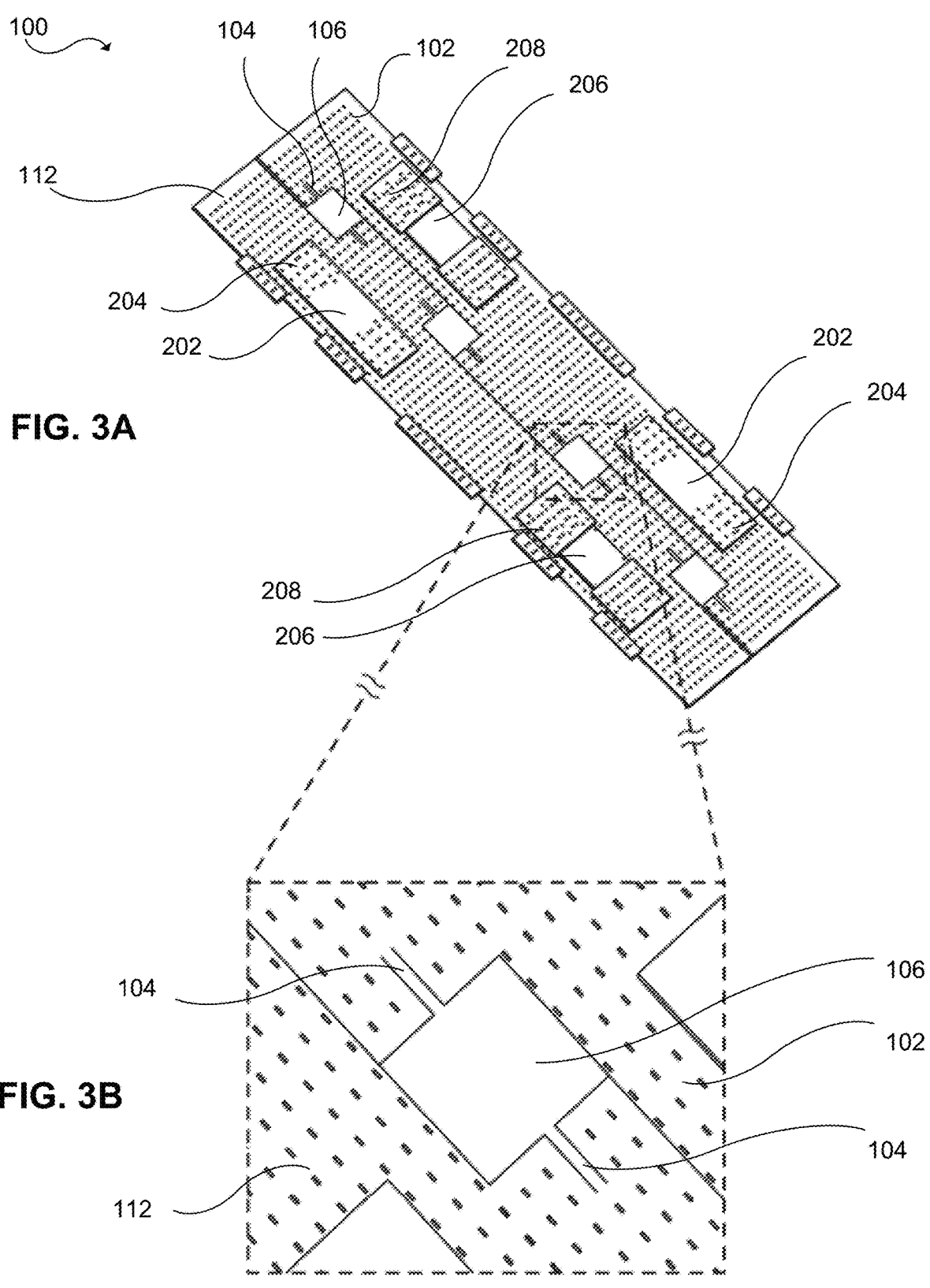
FIG. 3A is a perspective view of an exemplary out-of-plane accelerometer having a dual proof mass topology, according to an exemplary embodiment of the present invention.
FIG. 3B is a detail view of a center support having two torsional tethers, according to an exemplary embodiment of the present invention.

FIG. 3A is a perspective view of an exemplary out-of-plane accelerometer 100 having a dual proof mass topology, according to an exemplary embodiment of the present disclosure. In contrast to the exemplary device shown in FIG. 2, the out-of-plane accelerometer 100 comprises a first proof mass 102 and a second proof mass 112. In some embodiments, the first proof mass 102 may be connected to the underlying substrate at a center support 106, the second proof mass 112 may be connected to the underlying substrate at a center support 106. In some embodiments, the first proof mass 102 and the second proof mass 112 may be mirror symmetric with respect to each other. For example, at one side of the center support 106, a first proof mass 102 may be connected to the center support 106 by a torsional tether 104, at the other side of the center support 106, a second proof mass 112 may be connected to the same center support 106 by an additional torsional tether 104.

As described herein, an out-of-plane accelerometer 100 may comprise one or more electrodes 202, 206 and one or more sensing plates 204, 208. The sensing plates 204, 208 may be either attached to the fixed electrode (as in first electrode 202) or attached to the proof mass 102, 112 (as in second electrode 206). In some embodiments, each feature disposed on the first proof mass 102 may also be disposed on the second proof mass 112. For example, in FIG. 3A, one side of the out-of-plane accelerometer 100 has a first proof mass 102 having a first sensing electrode 202 and a second sensing electrode 206, a second side of the out-of-plane accelerometer 100 has a second proof mass 112 also having a first sensing electrode 202 and a second sensing electrode 206. In the figure, the first sensing electrodes 202 and the second sensing electrodes 208 are disposed at opposite ends along the width of the proof masses 102, 112, which is in accordance with some embodiments. In other embodiments, the respective sides of the accelerometer 100 may be exact mirror reflections, i.e., the first sensing electrodes 202 are disposed at one end of the accelerometer 100 and the second sensing electrodes 206 are disposed at a different end.

In some embodiments, a first proof mass 102 and a second proof mass 112 may be connected to four center supports 106 via eight torsional tethers 104, as shown. However, the embodiment shown in FIG. 3A is merely exemplary, and any other number of torsional tethers 103 and center supports 106 are contemplated. Additionally, although FIG. 3A depicts an out-of-plane accelerometer 100 having four electrodes 202, 206 any number of electrodes are contemplated, and any number of first sensing electrodes 202 and second sensing electrodes 206 are contemplated. As will be appreciated, any combination of the features described herein may be com FIG. 3B is a detail view of a center support 106 having two torsional tethers 104, according to an exemplary embodiment of the present disclosure. As described above, a first proof mass 102 may be disposed at one side of a center support 106 and a second proof mass 112 may be disposed at the opposite side of the center support 106. Again, in some embodiments, the first proof mass 102 and the second proof mass 112 may be mirror symmetric with respect to each other, i.e., a first proof mass 102 extends from the center support 106 in one direction and a second proof mass 112 extends from the center support 106 in the opposite direction. Other embodiments are contemplated, however. For example, in some embodiments, an out-of-plane accelerometer 100 may comprise a first proof mass 102 attached to a center support 106 extending in one direction, and the accelerometer 100 may comprise a second proof mass 112 attached to a different center support that is not shared with the first proof mass 102. In these embodiments, a second proof mass 112 may be positioned at a diverging angle from the first proof mass 102. For example, a second proof mass 112 may be disposed at a 90° angle to the first proof mass 102. Any other angle is contemplated and is possible with the presently described systems.

Figure 4:
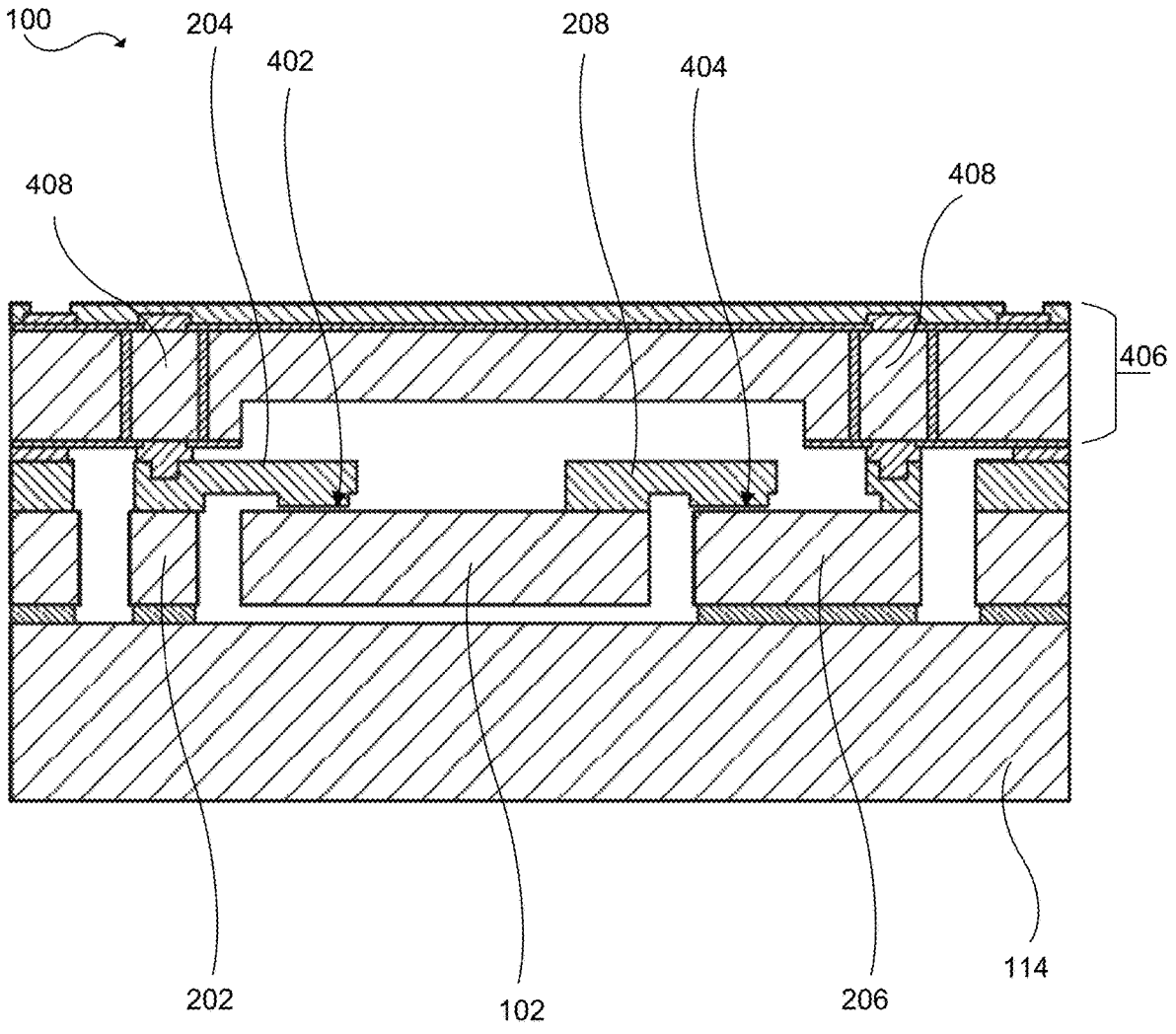
FIG. 4 is a cross-sectional view of an exemplary out-of-plane accelerometer having a differential sensing topology, according to an exemplary embodiment of the present invention.

FIG. 4 is a cross-sectional view of an exemplary out-of-plane accelerometer 100 having a differential sensing topology, according to an exemplary embodiment of the present disclosure. As described above, an out-of-plane accelerometer 100 may comprise multiple sensing plates, and the sensing plates may be disposed either on the fixed electrode or a proof mass. FIG. 4 depicts both types of electrode configurations. A first sensing electrode 202 may be connected to the underlying substrate 114 of the device. A sensing plate 204 for the first sensing electrode 202 may be connected to the first sensing electrode 204, and the sensing plate 204 may extend at least partially across the surface of the proof mass 102. A second sensing electrode 206 may be connected to the underlying substrate 114 of the device. A sensing plate 208 for the second sensing electrode 206 may be connected to the proof mass 102, and the sensing plate 208 may extend at least partially across the second sensing electrode 206. In order to increase the sensitivity of the ACM and reduce its mechanical Brownian noise to less than 100 µg√Hz, the thickness of the proof mass 102 is typically chosen to be several tens of micrometers (typically 40-60 micrometers), substantially thicker than the thickness of the sensing plates 204, 208.

This dual-sensing topology may be referred to as a differential sensing. When an acceleration is applied to the accelerometer 100 toward the out-of-plane direction the proof mass 102, the proof mass 102 may either move toward the substrate 114 or away from the substrate 114. Taking an example where an acceleration moves the proof mass 102 toward the substrate 114, as the capacitive gap 402 between the sensing plate 204 and the proof mass 102 increases, the capacitive gap 404 between the sensing plate 208 of the second sensing electrode 206 decreases. When the acceleration moves the proof mass 102 away from the substrate 114, the opposite effect is produced. This differential topology may double the capacitive sensitivity of the out-of-plane accelerometer 100. However, though the differential topology may be employed in any embodiment described herein, in some embodiments an out-of-plane accelerometer 100 may comprise one of the two configurations.

As described above, in some embodiments the features of the device may be disposed within a casing that provides vacuum environment. In some embodiments, a capping wafer 406 may enclose the device. The capping or cap wafer 406 may provide the casing to provide the vacuum environment for the out-of-plane accelerometer 100. The capping wafer 406 may have through-wafer-vias or through-silicon-vias (TSV) 408 to access the device sensing electrodes. In some embodiment, the capping wafer 406 can be replaced with a CMOS wafer that contains the interface and readout electronics for the ACM.

Figures 5A, 5B:
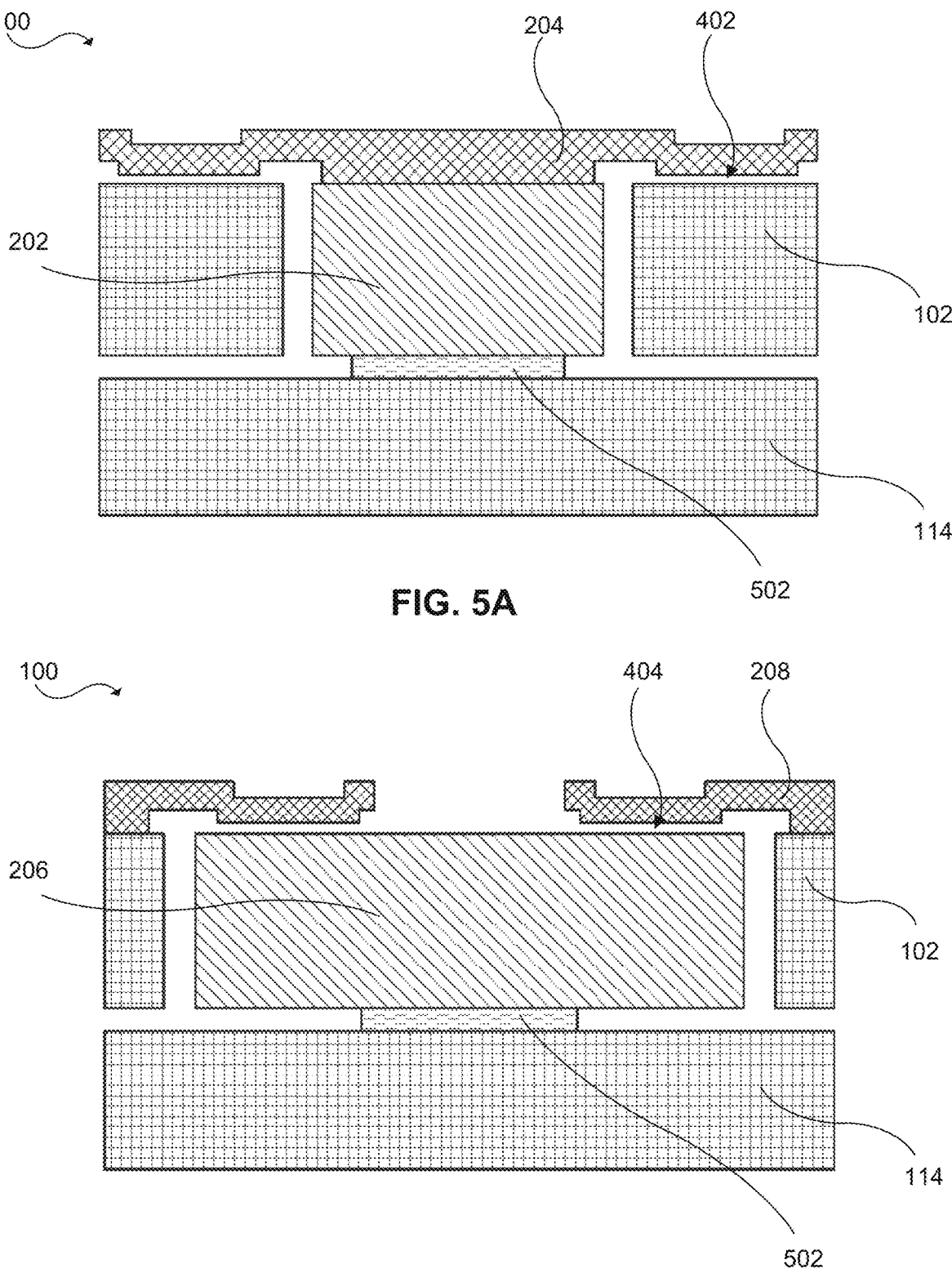
FIG. 5A is a cross section of an exemplary out-of-plane accelerometer and depicts a sensing plate attached to a fixed electrode, according to an exemplary embodiment of the present invention.
FIG. 5B is a cross section of an exemplary out-of-plane accelerometer and depicts a sensing plate attached to a proof mass, according to an exemplary embodiment of the present invention.

FIG. 5A is a cross section of an exemplary out-of-plane accelerometer 100 and depicts a sensing plate 204 attached to a fixed electrode 202, according to an exemplary embodiment of the present disclosure. As described herein, in some embodiments, a sensing plate 204 may be connected to a sensing electrode 202. The sensing plate 204 may extend at least partially across the surface of a proof mass 102. FIG. 5A also depicts the capacitive gap 402 present between a sensing plate 204 and the proof mass 102 in such an embodiment.

As will be appreciated, various materials or combinations of materials may be used for the different components of an out-of-plane accelerometer 100. An exemplary material for a sensing plate 204 is polycrystalline silicon. The sensing plate 204 may comprise other materials, including but not limited to silicon carbide, polycrystalline silicon carbide, germanium, silicon nitride, silicon dioxide, aluminum nitride, copper, gold, nickel, aluminum and/or alumina. An exemplary material for the underlying substrate 114 is single crystal silicon. The substrate 114 may comprise other materials, including but not limited to polycrystalline silicon, silicon carbide, polycrystalline silicon carbide, germanium, silicon nitride, silicon dioxide, glass, diamond, aluminum nitride, and/or alumina. An exemplary material for the proof mass 102 is single crystal silicon, although the proof mass 102 may also comprise polycrystalline silicon, silicon carbide, polycrystalline silicon carbide, germanium, silicon nitride, silicon dioxide, glass, diamond, aluminum nitride, PZT, alumina and/or any other material described herein. In some embodiments, an oxide layer 502 may be disposed between the substrate 114 and the sensing electrode 202.

FIG. 5B is a cross section of an exemplary out-of-plane accelerometer 100 and depicts a sensing plate 208 attached to a proof mass 102, according to an exemplary embodiment of the present disclosure. As described herein, in some embodiments a sensing plate 208 may be connected to a proof mass 102. The sensing plate 208 may extend at least partially across the surface of a sensing electrode 206. FIG. 5B also depicts the capacitive gap 404 present between a sensing plate 208 and the sensing electrode 206 in such an embodiment. As will be appreciated, the same materials or combinations of materials described above for FIG. 5A may be present in the components shown and described for FIG. 5B.

Figure 6A:
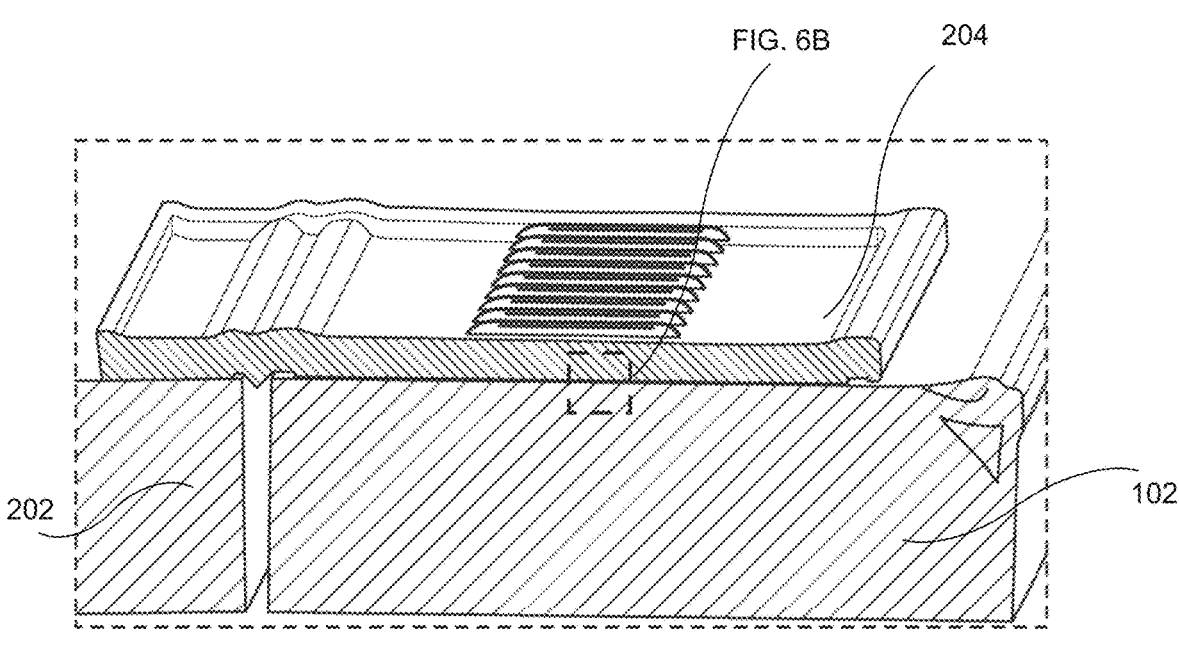
FIG. 6A depicts an exemplary out-of-plane accelerometer with a sensing plate attached to a fixed electrode, according to an exemplary embodiment of the present invention.
Figure 6B:
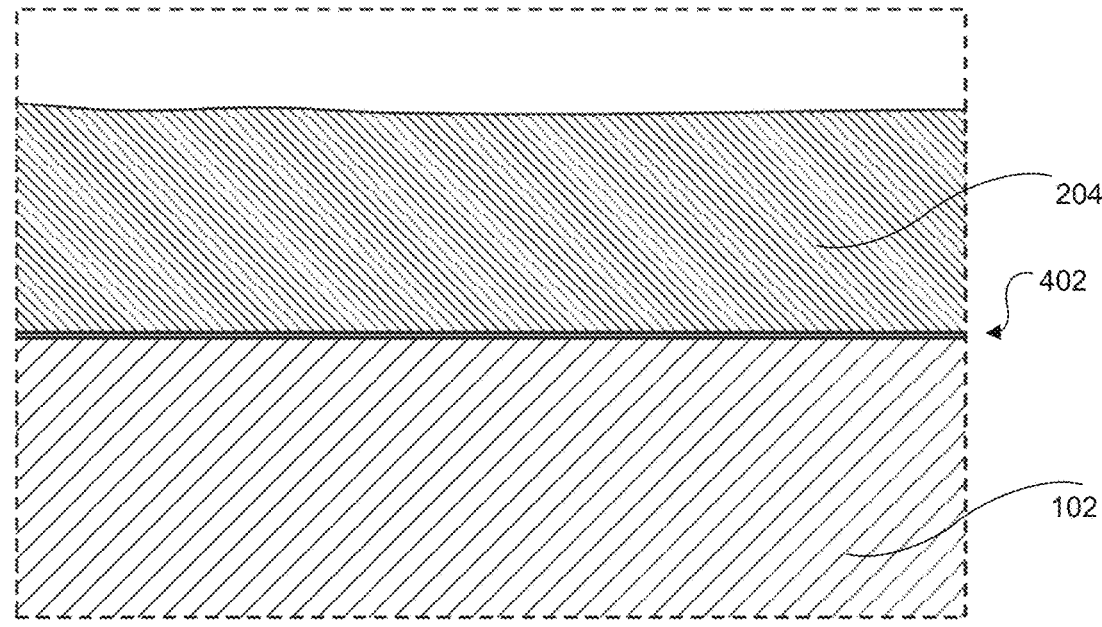
FIG. 6B is a detailed view of a capacitive gap disposed between a sensing plate and a proof mass, according to an exemplary embodiment of the present invention.

FIG. 6A depicts an exemplary out-of-plane accelerometer 100 with a sensing plate 204 attached to a fixed electrode 202, according to an exemplary embodiment of the present disclosure. FIG. 6B is a detailed view of a capacitive gap 402 that may be disposed between a sensing plate 204 and a proof mass 102. As described above, certain embodiments of the present disclosure create a stiffer construct by tethering the proof mass 102 to the center support 106 (not shown in FIGS. 6A-6B). Ordinarily, this construction would decrease the capacitive sensitivity of the out-of-plane accelerometer 100. In some embodiments, however, the capacitive sensitivity can be increased by increasing the proof-mass M by extending the proof mass width W 108 (shown in FIG. 1A) and/or thickening the substrate of the proof mass $H_{thk}$, following the relationship between proof-mass M and the rotated angle θ as expressed in Equation 1 above.

In some embodiments, the capacitive sensitivity of the out-of-plane accelerometer 100 may be increased by decreasing the capacitive gap (i.e., a capacitive gap 402 between a sensing plate 204 and a proof mass 102 and/or a capacitive gap 404 between a sensing plate 208 and a sensing electrode 206). Capacitive sensitivity is a strong function of gap size. The relationship is expressed by the following $$\frac{\Delta C}{\vec{a}} \approx \frac{4\varepsilon_0 A}{d^2}\frac{M}{K} = \frac{4\varepsilon_0 A}{d^2}\frac{1}{\omega_0^2} \qquad \text{Equation 4}$$

The equation shows that the capacitive sensitivity is a strong function of gap size d, indicating that by scaling down the distance between proof mass 102 and sensing electrode 202 (or the sensing plate 204), the scale factor may be improved without needing to reduce the resonant frequency $\omega_0$. Although the scaling of the capacitive gap 402 size may increase the stiction force, as expressed in Equation 2 ($\propto$ 1/d), the device electromechanical sensitivity has a stronger dependency on the capacitive gap 402 size ($\propto$ 1/$d^2$), meaning that by proper optimization, both fabrication yield and precision performance can be achieved at the same time. In preferred embodiments of the ACM, the capacitive sensitivity of the device (given by Equation 4) is at approximately a constant value for signals in the entire operating frequency range of the device, e.g. from DC to 10 kHz (known as a constant sensitivity).

In some embodiments, to increase the capacitive sensitivity of the out-of-plane accelerometer 100, it is conceived that the capacitive gap 402 may be smaller than 500 nm. As described herein, in an embodiment having a sensing plate 208 attached to a proof mass 102, the capacitive gap 404 between the sensing plate 208 and the sensing electrode 206 may also be smaller than 500 nm.

Experimental Section

The following section presents results from testing exemplary embodiments of the devices described herein. The following embodiments are not inclusive of all device designs described within this disclosure. Device Iteration 1 describes experimentation on an exemplary hinge-shaped MEMS accelerometer, such as the device described in the discussion for FIG. 3A. Device Iteration 2 describes testing an exemplary accelerometer as a contact microphone, and the section also describes testing the ACM as a body-worn auscultation device.

Design for Device Iteration 1

Prototypes of out-of-plane, hinge-shaped accelerometers were fabricated on a 60 μm-thick silicon-on-insulator (SOI) substrate. To implement a sub-micron sensing gap, a specific fabrication process, which employs a thermally-grown sacrificial oxide layer to define the vertical gap size, is used. First, vertical trenches, which define the geometry of the entire mechanical structure, were etched through the device layer using DRIE (Deep Reactive-Ion Etching) process and later filled with tetraethoxysilane (TEOS) oxide. To define the out-of-plane gaps, a 300 nm thermal oxide layer is grown on the surface of the wafer followed by the deposition and patterning of the polysilicon for sensing electrodes. The device is then fully released in HF, and then dried using super critical dryer to avoid stiction. These devices enable integration of three-axis nano-gap accelerometers with wide bandwidth on a chip.

Measurements for Device Iteration 1

Figure 7:
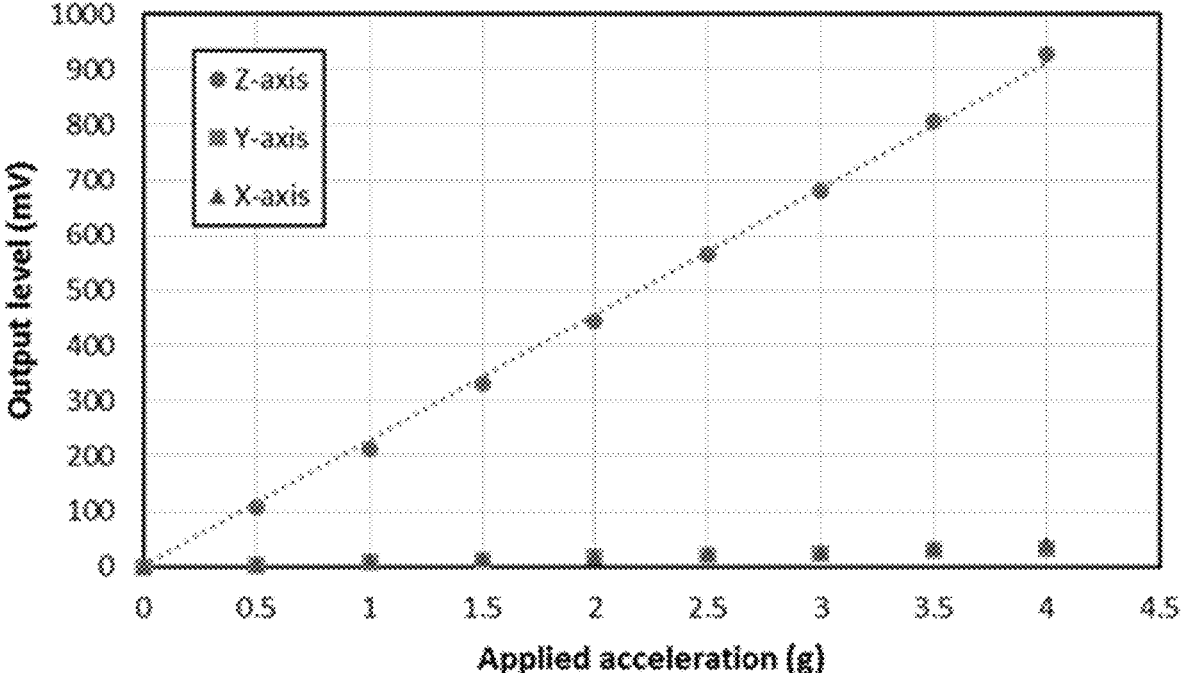
FIG. 7 is a graph of the measured scale factor of an exemplary MEMS accelerometer under ±4-g acceleration in all three-axes.

The overall performance of the MEMS accelerometer was characterized by interfacing with a capacitive readout circuit. The readout circuit was a switched-capacitor circuit, which consecutively charges and discharges the sensing electrodes to convert capacitance changes into the voltage. The measured waveform under ±1-g sinusoidal acceleration showed that the sensitivity of the proposed device is close to 1266 mV/g. Considering the gain of the circuit is 8.71 mV/g, the capacitive sensitivity is back-calculated as 145.35 fF/g. To evaluate overall scale-factor of the accelerometer, low-gain setting was used for the interface circuit, and higher acceleration levels up to ±4-g was applied using shaker table. FIG. 7 is a graph of the measured scale factor of the MEMS device under ±4-g acceleration in all three-axes. The figure shows that the cross-axis sensitivity is 2.46% and 2.89% for X- and Y-axis respectively, which is believed to be caused by the poor alignment between the device and the measurement setup as the simulated value is less than 0.1%.

Figure 8:
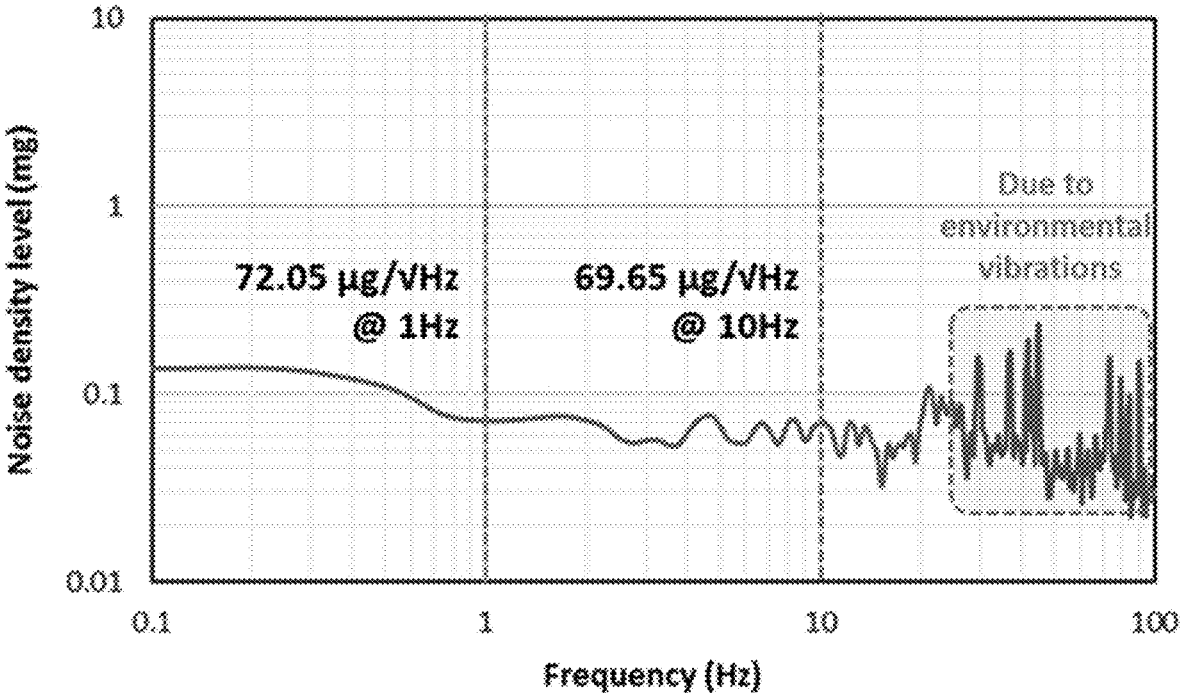
FIG. 8 is a graph depicting the measured noise density level of an exemplary MEMS accelerometer.

The noise performance of the proposed accelerometer was evaluated using a dynamic signal analyzer. FIG. 8 is a graph depicting the measured noise density level of the MEMS accelerometer. As shown in the figure, the measured noise density level is 72.05 μg√Hz at 1 Hz, and 69.65 μg√Hz at 10 Hz.

Figure 9:
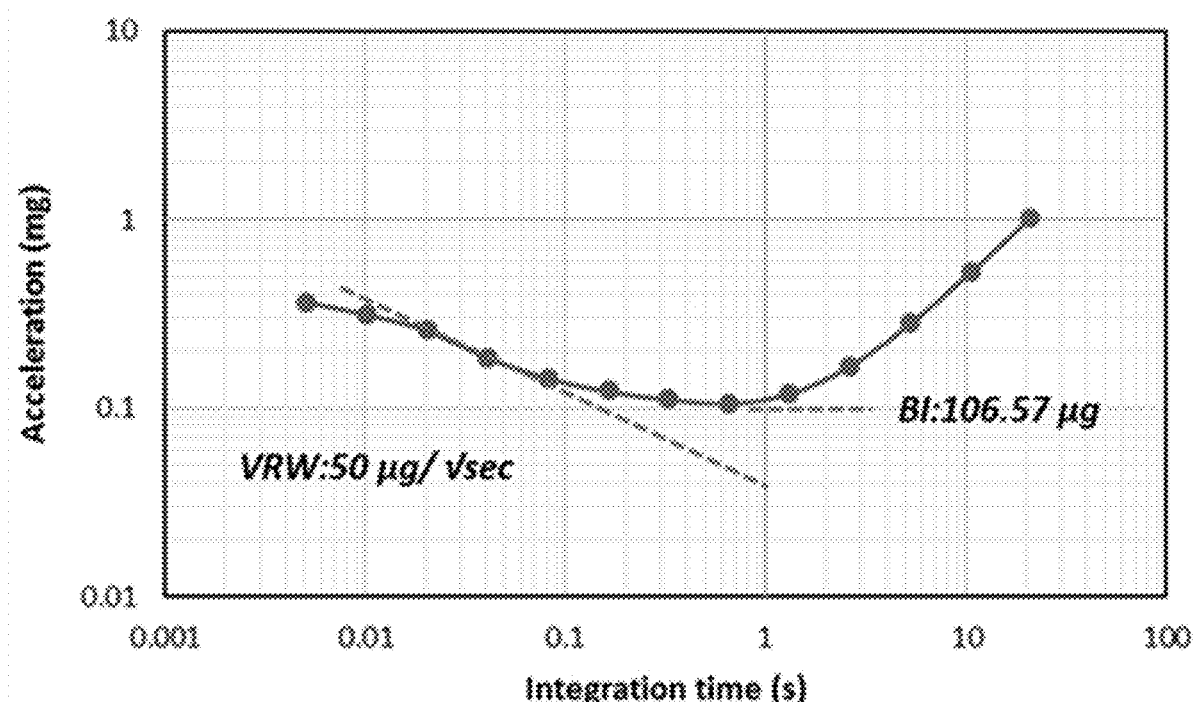
FIG. 9 is an Allan deviance plot of an exemplary MEMS accelerometer.

Finally, the output signal was continuously sampled for a long period at room temperature to create an Allan Variance plot. FIG. 9 is an Allan deviance plot of the MEMS accelerometer. The bias instability was 106.5 μg and the VRW was 50 μg√Hz. These values are in good agreement with the noise density measurement results presented in FIG. 8. The fact that the output noise spectrum has higher flicker noise compared to thermal noise indicates that the overall resolution is mostly dominated by the electronics.

Figure 10:
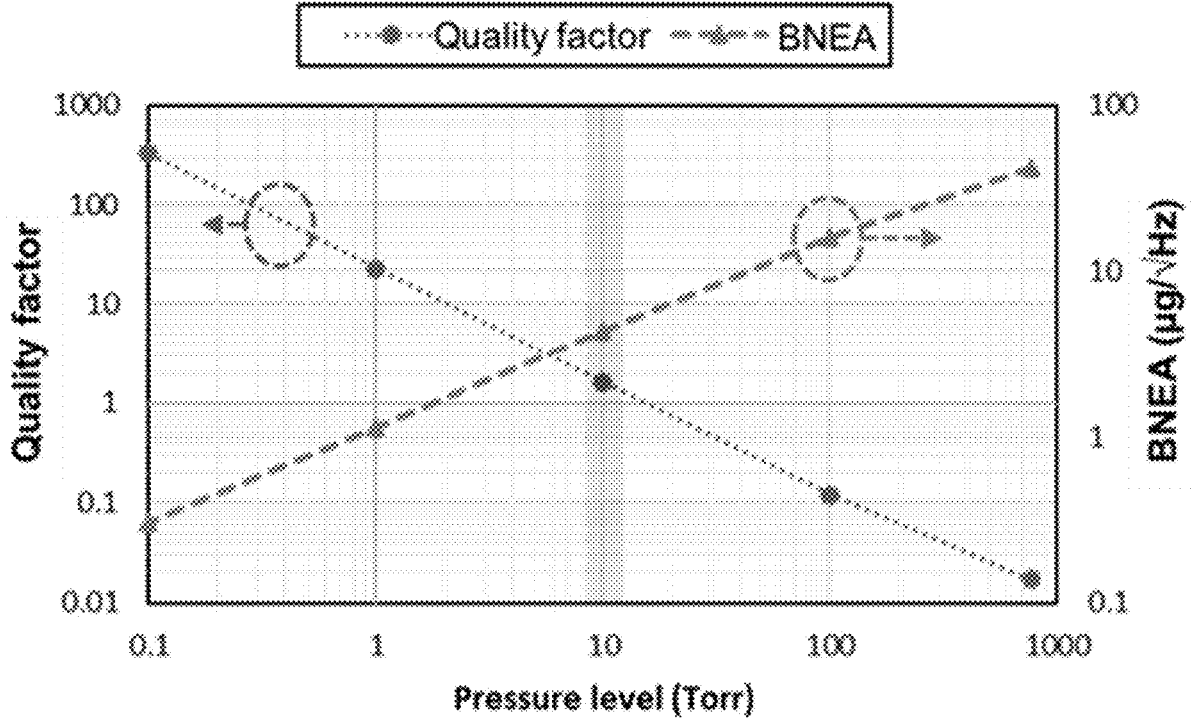
FIG. 10 depicts a simulated quality factor and Brownian noise equivalent acceleration of an exemplary MEMS accelerometer at different pressure levels.

Additionally, it should be noted that, even though the device may be designed to be operated at a low-pressure level (e.g., ~10 Torr), some of the MEMS devices were measured in atmospheric pressure (760 Torr). In atmosphere, the device would be heavily over-damped due to the small gaps, which results in an increased Brownian noise equivalent acceleration (BNEA) of 48.8 μm√Hz. This is close to a 10× increase compared to the estimated BNEA of ~5 μg√Hz at a targeted 10 Torr pressure level. FIG. 10 depicts a simulated quality factor and BNEA of the MEMS accelerometer at different pressure levels. FIG. 10 shows that even though the pressure may be reduced to 10 Torr, the operation of accelerometer will be still near critically-damped condition (Q~0.7), resulting in a stable output response. Therefore, from these tests and from the simulation, it is shown that by operating the device at moderate vacuum level of ~10 Torr, the overall noise performance is expected to reach <10 μg√Hz.

TABLE 1 represents a performance summary of the MEMS accelerometer measured in the presently described experiment

TABLE 1

| Parameter | Value | Units |
|---|---|---|
| Device Size | 4 × 1.4 × 0.06 | mm³ |
| Resonant Frequency | 12.73 | kHz |
| Scale Factor | 1266 (High-gain) | mV/g |
|  | 213 (Low-gain) |  |

TABLE 1-continued

| Parameter | Value | Units |
|---|---|---|
| Device Sensitivity | 145.35 | fF/g |
| Cross-Axis Sensitivity | 2.46 (X-axis) | % |
| | 2.89 (Y-axis) | |
| Noise Density Level | 72.05 @ 1 Hz | µg√Hz |
| | 69.05 @ 10 Hz | |
| Velocity Random Walk | 50 | µg√Hz |
| Bias Instability | 106.57 | µg |
| Brownian noise (BNEA) | 5.1 @ 10 Torr | µg√Hz |
| | 48.8 @ 760 Torr | |

Conclusions for Device Iteration 1

The novel "hinge-shaped" out-of-plane accelerometer achieves very high fabrication yield despite having nano-gaps. Also, increased electromechanical coupling attained from the nano-sensing gap extends the operational bandwidth while attaining µ-g noise level. Finally, the devices may achieve the stable quasi-static operation in a wide pressure range, yielding a single-digit µ-g noise at 10 Torr pressure. The designs described herein provide a potential solution for an accelerometer having wide operational bandwidth and precision performance to meet increasing demands from the newly emerging applications, such as wearables and health informatics.

Background for Device Iteration 2

The following experimentation compared the performance of an ACM against the performance of a commercial piezoelectric contact microphone. As described previously, the MEMS devices described herein may be used as a contact microphone, as the vibrations caused by sounds are subject to capture by an accelerometer.

It is useful to express vibration in terms of acceleration, rather than velocity or displacement. To capture high quality audio signal using an accelerometer as a contact microphone, small MEMS accelerometers with wide operational bandwidth and micro-g resolution are needed. Considering use of an encapsulated accelerometer as a contact microphone, there is an absence of a through-hole to generate any acoustic pressure on the MEMS device. The acoustic vibrations are therefore expressed in units as Vibration Acceleration Level (VAL) rather than Sound Pressure Level (SPL). This relationship is provided by $$L_a = 10 \, \log\left[\left(\frac{a}{a_{ref}}\right)^2\right] \, dB \qquad \text{Equation 5}$$

Here, $a_{ref}$ corresponds to a reference acceleration, typically 1 µg (9.8 µm/sec$^2$). The sensitivity of a microphone is defined as the ratio of the electrical output of the device to a given standard acoustic input. Typical acoustic microphones use a 1 kHz sinusoidal signal at 94 dB SPL (equivalent to 1 Pa pressure) as the standard pressure input for characterization. Analogous to pressure input, the sensitivity of the ACM can be characterized by measuring the electrical response to a standard vibration input of a 1 kHz sinusoidal signal at 120 dB VAL (equivalent to 1 g acceleration).

Design for Device Iteration 2

Figure 11:
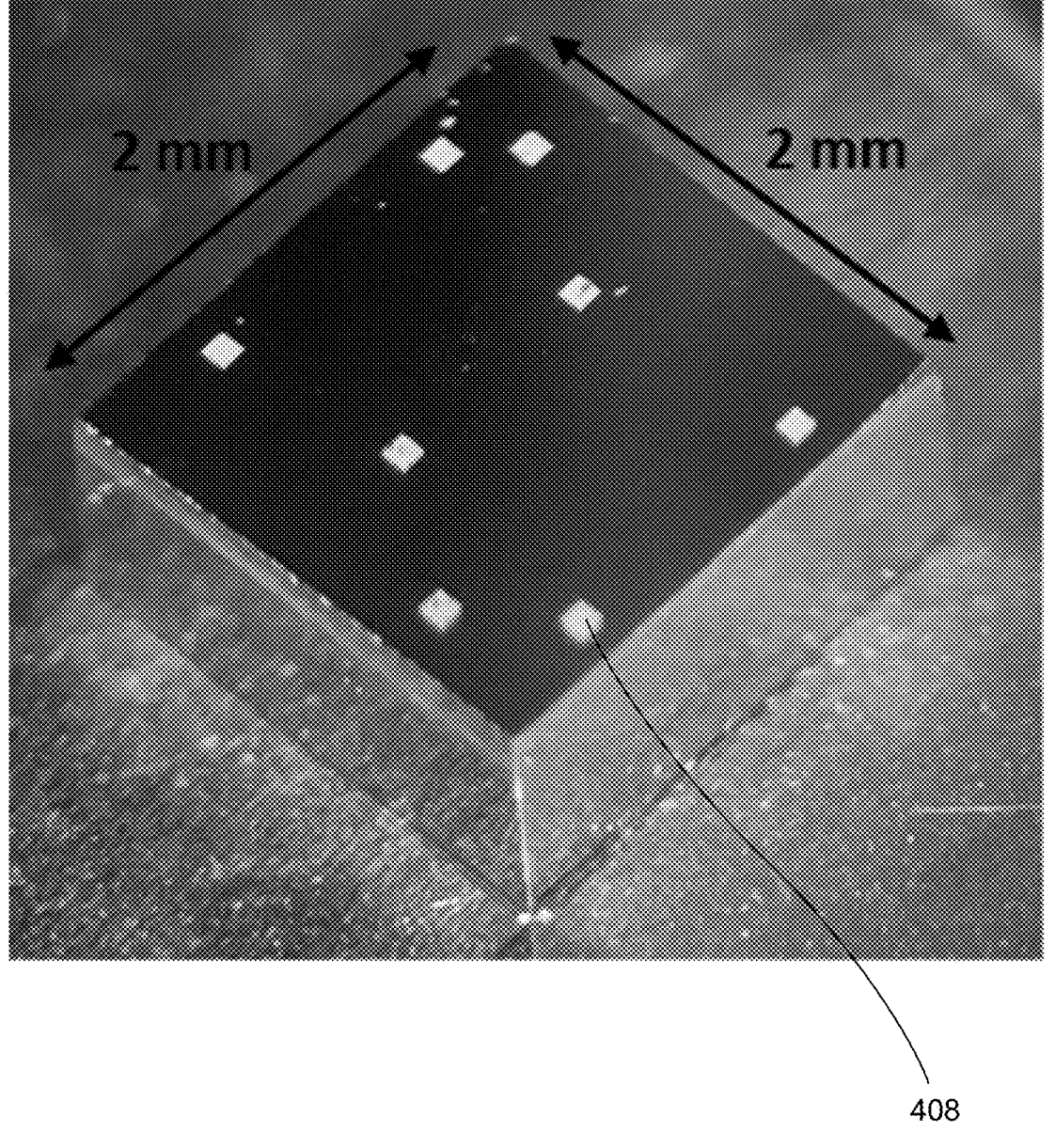
FIG. 11 depicts an exemplary wafer level packaged die, according to an exemplary embodiment of the present invention.

A torsional cantilever topology was chosen to implement the micro-g ACM, wherein the proof mass was supported by torsional tethers at one end. The device was designed in accordance with the exemplary device shown in FIG. 2. When acceleration is applied in an out-of-plane direction, generated torque rotates the proof-mass, changing the capacitance between sensing electrodes. To maintain a small form factor, the sensing electrodes were placed within the proof mass, and a differential top electrode configuration was employed to suppress common mode noises. The device was fabricated using the HARPSS+ process on an SOI wafer having 40 µm thick device layer with ~270 nm capacitive gaps. After the releasing process, a completed wafer was then wafer-level packaged using eutectic bonding to a silicon capping wafer with built-in TSVs. FIG. 11 depicts an exemplary wafer level packaged die, and the TSVs 408 can be seen along the surface of the die (TSVs also shown in FIG. 4).

Measurements for Device Iteration 2

Figure 12:
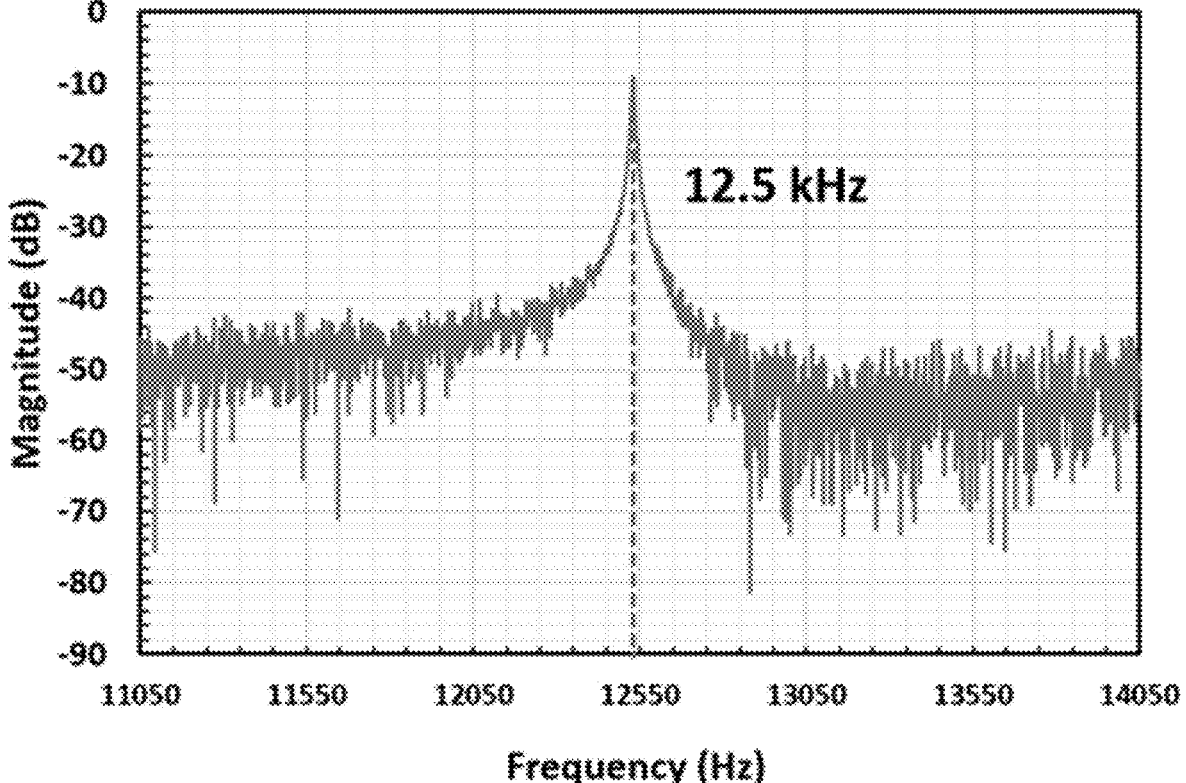
FIG. 12 is a graph of the measured resonant frequency of an exemplary MEMS accelerometer.
Figure 13:
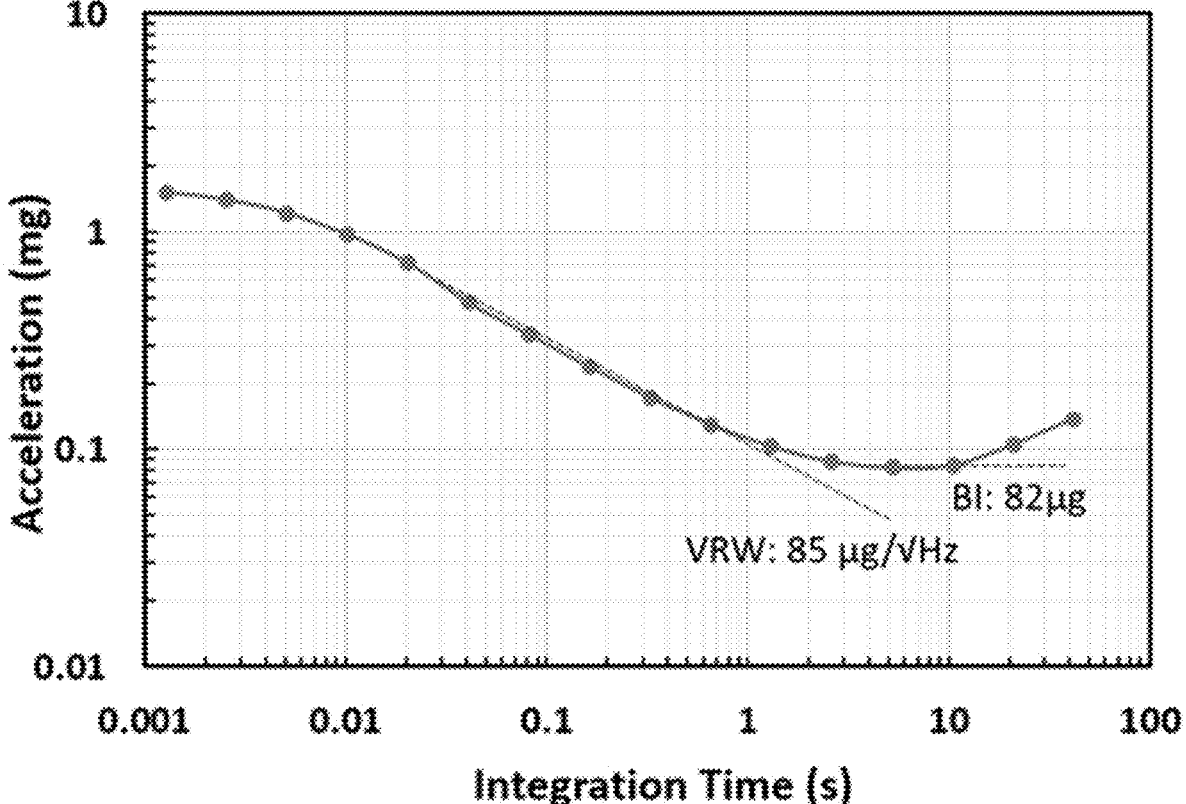
FIG. 13 depicts the Allan deviance plot for an exemplary ACM.

The microphone was interfaced with a commercially available off-the-shelf capacitive readout circuit. A miniature PCB (0.8 inch×0.8 inch) was designed to accommodate the sensor and interface circuit by utilizing the front and back side of the board to mount the MEMS device and interface IC. The MEMS die was covered using adhesive to protect the bond wires from accidental damage. To measure sensitivity, the evaluation board was mounted on a shaker table and a sinusoidal 1 g acceleration was applied at 1 kHz frequency. A dynamic signal analyzer was used to precisely measure the scale factor, showing 72.6 mV/g (−22.76 dB relative to 1V/g). The resonant frequency of the ACM was measured by placing an uncapped device into the vacuum chamber and exciting electrostatically using a network analyzer. The measured resonant frequency showed to be 12.5 kHz, shown in FIG. 12, which confirms a high operational bandwidth. FIG. 13 depicts the Allan deviance plot for the ACM. The plot is extracted by sampling the output at 1 kHz using a data acquisition card. The measured VRW and bias instability (BI) were 85 µg/µz and 82 µg, respectively.

Figure 14:
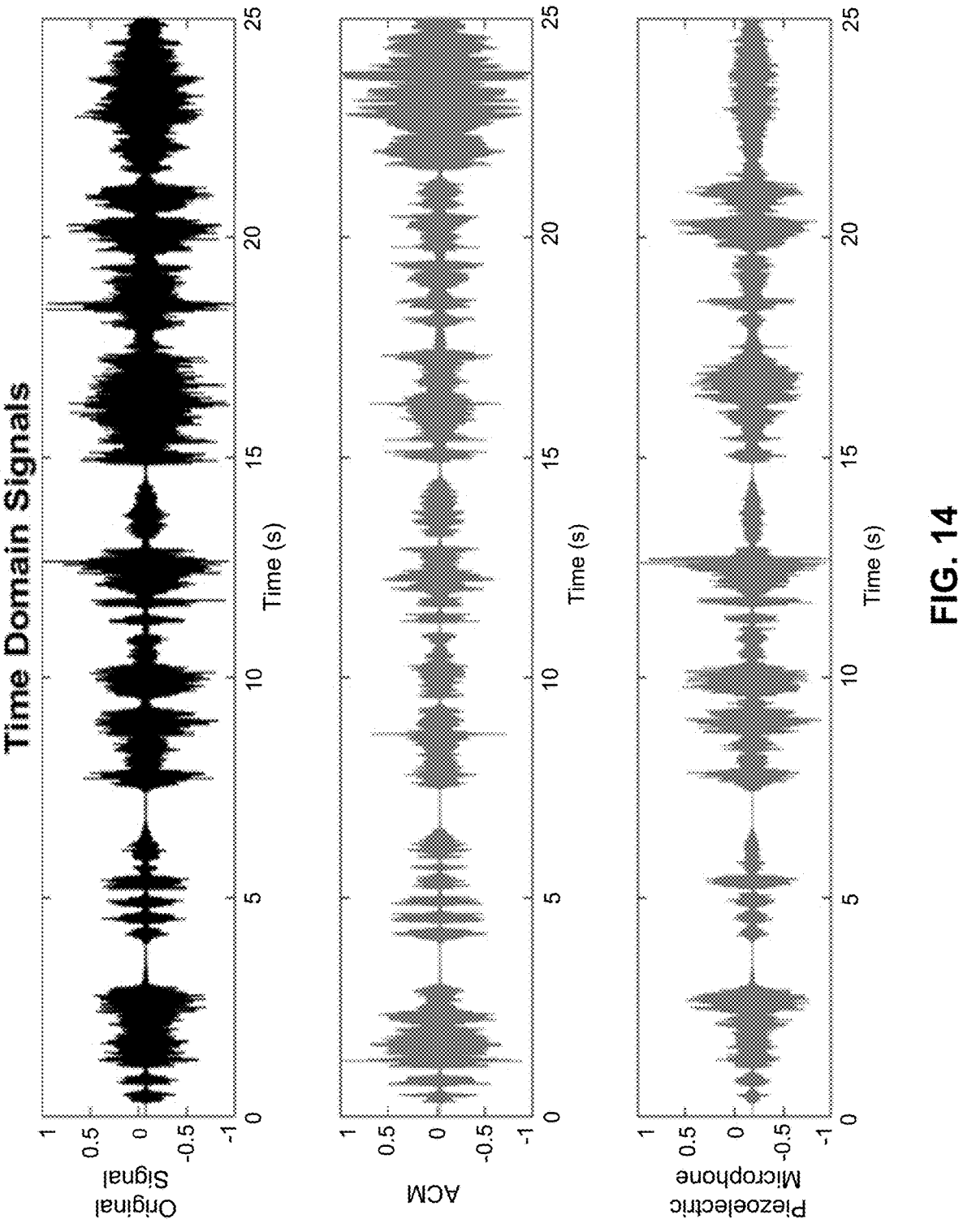
FIG. 14 shows the time domain signals for sounds recorded by an ACM and a piezoelectric microphone.

In the next stage of measurement, the performance of the ACM was compared with a commercially-available piezoelectric contact microphone. The form-factor of the MEMS ACM is ~10× smaller than the piezoelectric microphone. An audio reconstruction test was performed to validate the functionality of the ACM by mounting alongside the piezoelectric microphone on a speaker system. A test audio signal was played over the speaker, and the output from the microphones was recorded at 8 kHz sampling frequency. Using a custom program, the captured data was reconstructed into an audio file format for playback. FIG. 14 shows the time domain signals for the original audio clip along with the recorded data for the piezoelectric microphone and the ACM. A high degree of similarity is observed between the recorded sounds and original audio clip. High frequency components (>2 kHz) are not picked up by the ACM due to its operation in air. However, on playback, the ACM demonstrates high quality signal, specifically at lower frequencies, compared to the piezoelectric microphone, which exhibits noticeable distortion. This behavior can be attributed to the ACM's inherent ability to capture high quality signals at low frequencies, including the inaudible range (0-20 Hz), unlike the piezoelectric contact microphones.

Measurements for Device Iteration 2 as a Body-Worn Auscultation Device

Several auscultation locations for cardiopulmonary sounds are available in the intercostal spaces (ICS) (i.e., the space between two consecutive ribs) on the chest. The device described above for Device Iteration 2 was tested as a method of sensing cardiopulmonary sounds, which lie between 20 to 2500 Hz frequency range. The sounds were recorded by mounting the ACM left of the sternum in the 5th intercostal space. The PCB was held in place using a chest strap to provide firm contact between the board and skin.

The senor board was interfaced with a data acquisition card to collect the data and a custom program was used to filter the recorded signals which can be further stored in audio file format for playback.

Unlike piezoelectric microphones, the ACM can measure accelerations down to DC level. This attribute of an ACM can be used to obtain additional information such as body motion, heart rate, respiratory rate, and even ballistocardiogram signal (which lie in the inaudible range of from between 0 Hz and 20 Hz). Moreover, using an array of the ACMs can result in high-precision activity detection of the user, thus providing an additional layer of information for correlation of auscultation to daily activities. The higher frequency components (>20 Hz) of the recorded signal correspond to the cardiopulmonary sounds.

Figure 15:
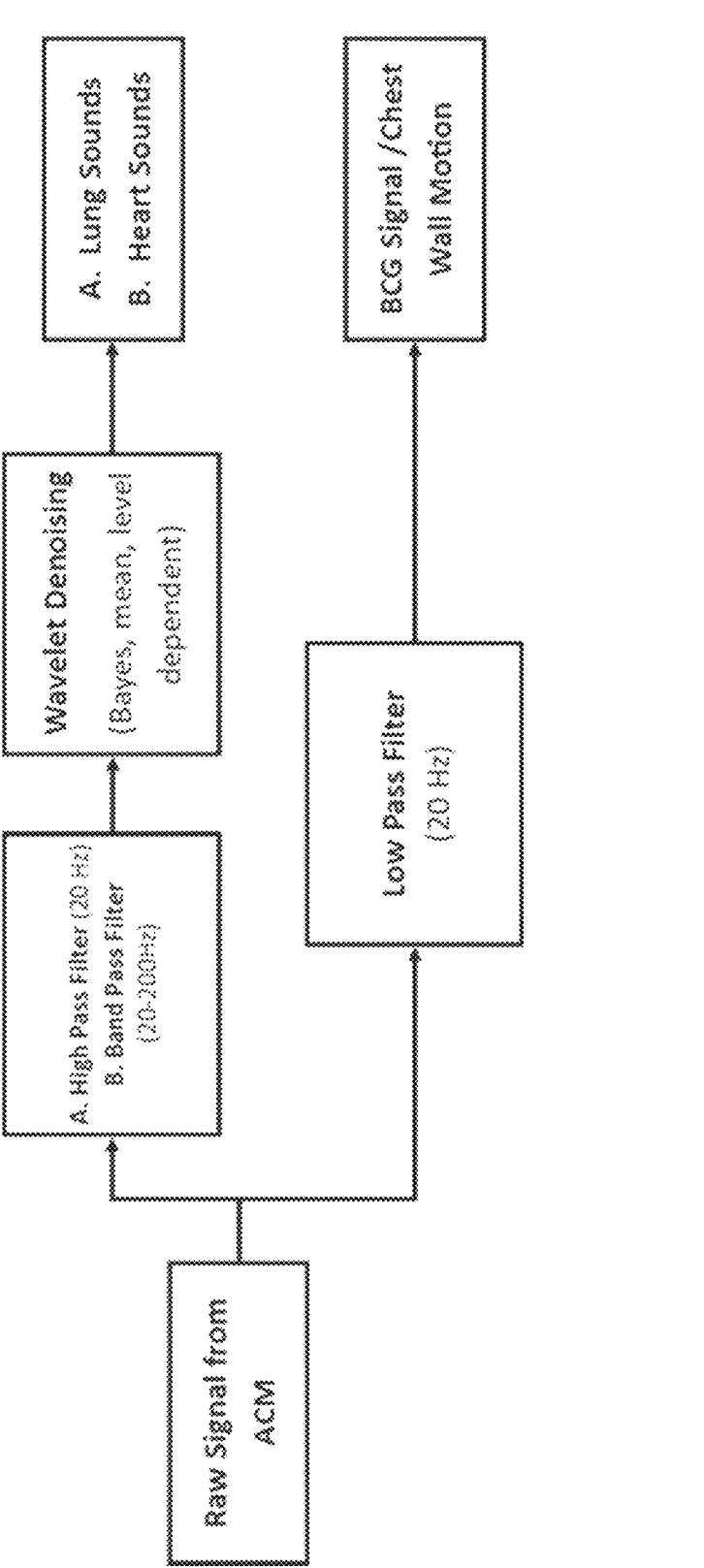
FIG. 15 is an exemplary filtering algorithm used to separate low frequency components of chest wall motion and high frequency components of heart sound signals.

FIG. 15 is an example filtering algorithm that was used to separate the low frequency component of chest wall motion and the high frequency component of the sound signal. The filtering was performed using high-order Butterworth filters on the basic criteria of audible (>20 Hz) and inaudible frequencies (<20 Hz). A wavelet denoising technique was used on the high frequency components to reduce noise and extract signal features.

Figure 16A:
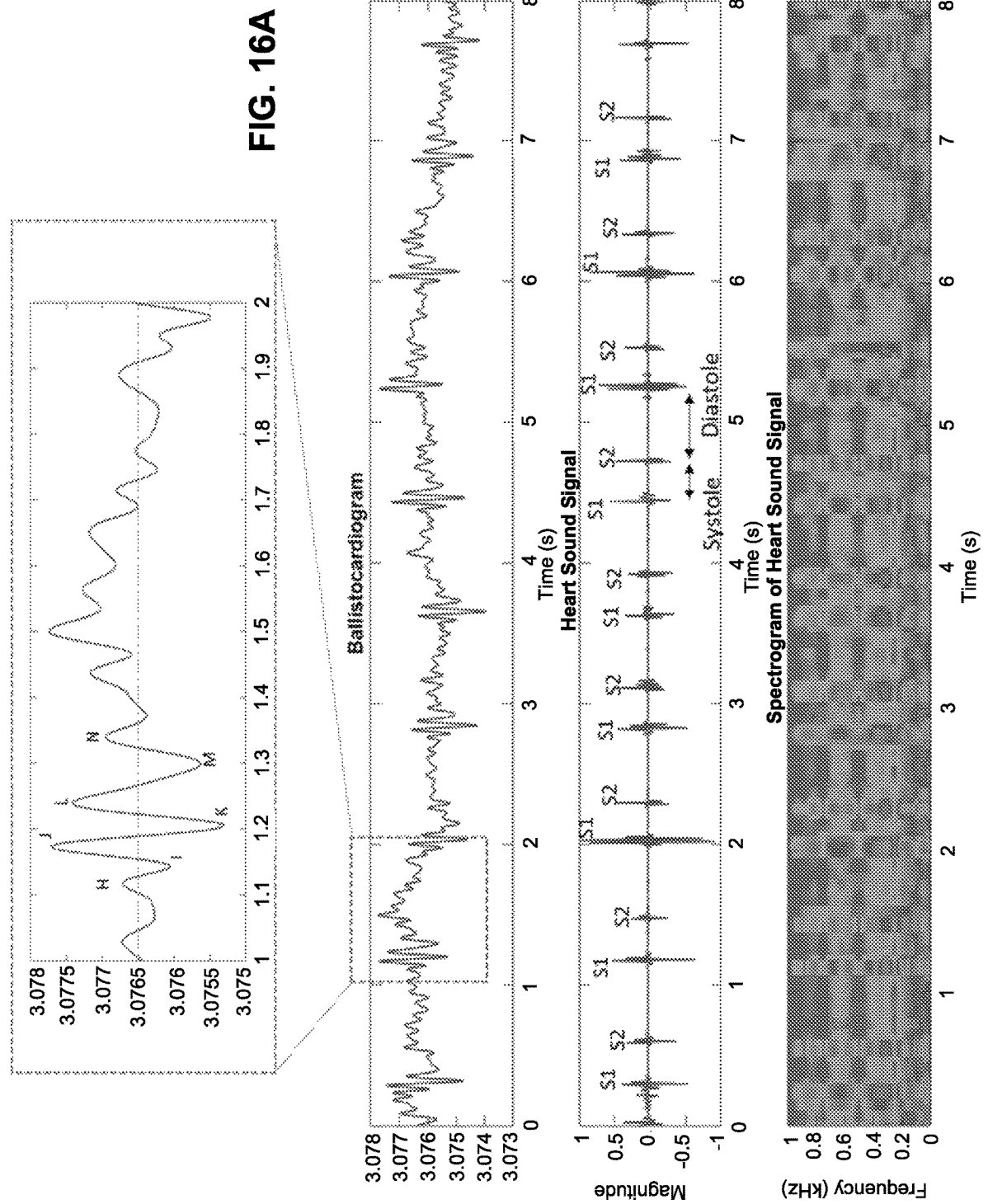
FIG. 16A depicts heart sound vibrations recorded by an exemplary ACM.
Figure 16B:
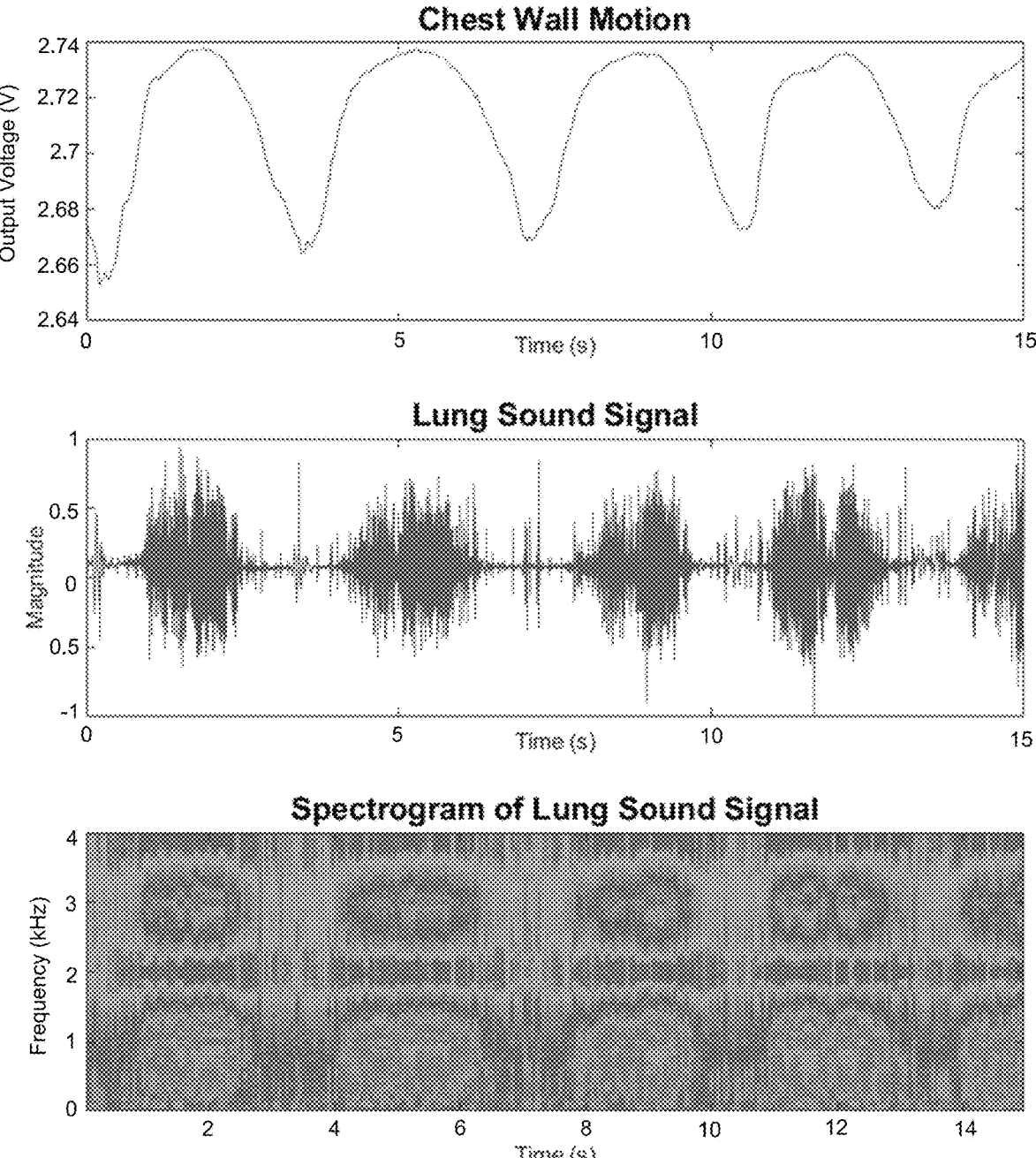
FIG. 16B depicts lung sound vibrations recorded by an exemplary ACM.

FIGS. 16A and 16B depict the resultant waveforms from testing the ACM as a device for sensing cardiopulmonary sounds. FIG. 16A depicts the recorded heart sound vibrations, and FIG. 16B depicts the recorded lung sound vibrations. There are two major cardiac sounds, S1 and S2, which occur due to closing of the atrioventricular valves (Mitral and Tricuspid) and closing of the semilunar valves (Aortic and Pulmonary), respectively. The period from S1 to S2 is known as Systole, whereas the S2 to S1 period is known as Diastole, which is marked on the heart sound signal chart of FIG. 16A. The recorded signal, known as phonocardiogram (PCG), is characterized by a "lub-dub" sound and provides a solid foundation for a preliminary diagnosis, based on the frequency content and amplitude of the signal, of any cardiac disease.

Another feature captured along with the heart sounds is the ballistocardiogram (BCG) signal, defined as the micro-movements of the body due to shift in center of mass with the pumping of blood at every heartbeat. As this signal lies in the frequency range of 0-20 Hz, it is typically captured using a precision micro-g accelerometer. The dual nature of the proposed ACM enables the detection of the BCG signal, while also measuring cardiac sounds. As shown in FIG. 16A, the BCG signal is characterized by the H, I, J, K, L wave, forming a "W" pattern within the waveform. The importance of capturing this waveform is marked by its unobtrusive nature and ability to detect early onset of several diseases, including but not limited to acute myocardial disease, asymptotic coronary artery disease, and congestive heart failure.

Auscultation of the lungs provides vital information regarding their physiology, such as obstructions in the airway or presence of liquid in the organ. The qualities of breath sounds modify as air passes through the lungs. The pitch and duration of recorded lung sounds differ with respect to location of the senor. The presence of adventitious breath sounds such as crackles or wheezes may indicate disease. To accurately identify the timing of abnormal breath sounds within a respiratory cycle, the inspiration and expiration can be monitored by tracking the movement of the chest wall. Normal "vesicular" breath sound recorded by the present ACM is shown in FIG. 16B. The ACM demonstrates high-fidelity cardiopulmonary auscultation sensing capability as well as high sensitivity towards motion artifacts.

Characteristic features of heart sounds, BCG signal, and lung sounds are easily detected using the ACM.

Conclusions for Device Iteration 2

The ACM, whose functionality and feasibility were validated by an audio reconstruction test followed by an on-body auscultation test to capture heart and lung sounds, along with simultaneous recording of BCG signals and chest wall motions, represents as a major step towards the goal of integrating small form-factor MEMS devices into sensors. By integrating the functionality of a microphone and an accelerometer in a single MEMS device, the cost of manufacturing wearable devices and other vibration-sensing devices can be reduced significantly.

Common Use Examples

As described here, the present disclosure describes MEMS devices, and the exemplary devices provide various attributes that may be used in a variety of settings. One example described herein is the potential for the devices to be used in tracking movement, or navigation in a space. In some embodiments, the out-of-plane topology of the proof-mass/torsional-tether configuration provides three-axis acceleration sensing. These embodiments have the potential for being used in compact wearables. For example, and not limitation, the three-axis acceleration sensing may be employed in wearables such as a watch, necklace, and/or strap that may be positioned upon a person. The increase in the adoption and use of fitness trackers, for example, provides a prime platform that may benefit from a small form-factor accelerometer with a high sensitivity. As described herein, exemplary embodiments of the present disclosure exhibit a sub-100 μg gElz vibration acceleration sensitivity, as shown in Device Iteration 1, which measured a noise density level of 72.05 μg√Hz at 1 Hz, and 69.65 μg√Hz at 10 Hz. In other words, the design in Device Iteration 1 produced a vibration acceleration sensitivity of better than 100 μg√Hz at 1 Hz and at 10 Hz.

Other potential uses for the various devices described herein include providing an ACM. One setting that may benefit from accelerometers that have a wide operational bandwidth (ranging from between 0 Hz and 10,000 Hz, for example) and low-noise performance (sub-100 μg√Hz vibration acceleration sensitivity, for example), is in the health informatics settings. As shown above in Device Iteration 1, embodiments of the devices described herein may comprise a resonant frequency at least as high as 12.73 kHz. Therefore, embodiments of the present disclosure exhibit the wide operation bandwidth required to monitor both heart and lung sounds. For example, ballistocardiogram signals may cause vibrations ranging from DC to around 20 Hz, and lung sounds may cause vibrations ranging from a few hundred Hertz to around 6,000 Hz. The operation bandwidth of the ACMs described herein are able to capture the entire range of these bodily vibrations.

It is contemplated that the devices, when used as an ACM, may be incorporated into devices that contact a human body. A contact microphone is most effective when in contact with the source of the vibrations. This is because ACMs are not sensitive to air-borne acoustic emissions and are only sensitive to vibrations from its contact source. An ACM may be placed directly on the skin or directly upon a fabric or other material in contact with the skin. In other words, embodiments of the present disclosure do not require direct contact with the skin surface and can be worn over clothing and accessories without significantly degrading the signal. It is conceived, therefore, that an ACM may be incorporated into a stethoscope, a wristwatch, a necklace, a wearable strap, a patch worn on the body, or any other device or material that contacts the body. As will be appreciated, an ACM may be incorporated into any number of additional devices that may contact the body or a fabric contacting the body. In some embodiments, the device may include an encapsulated ACM device die covered with a protective epoxy coating (such as the adhesive discussed in Device Iteration 2) to prevent damage from, including but not limited to, moisture, sweat, and/or body heat. Additionally, it will be appreciated that the devices described herein are not limited to human subjects, as the devices may be incorporated into a device capable of sensing the vibrations emanating from any animal subject, for example in a veterinary setting.

In some embodiments, a MEMS device as described herein is capable of sensing a plurality of vibrations and accelerations. For example, the devices described herein are not limited to either tracking accelerations due to movement (i.e., navigation in space) or sounds emanating from the subject, the devices may track both accelerations. Using a wristwatch as an example, one MEMS device described herein may track both movement of an individual through space and the vibrations, such as heart-rate sounds, emanating from the individual. This is a significant improvement for wearable devices, as small form-factor is of great interest. Because the devices described herein are both small and are capable of tracking a plurality of vibrations, the space required for a MEMS device is further decreased by using certain embodiments described in the present disclosure.

As will be appreciated, more than one ACM may be positioned about a subject to receive additional health information. For example, an array of contact microphones may be positioned upon a patient. The positioning of the microphones depends on which vibrations are to be recorded. For example, the contact microphones may be positioned at an intercostal space. Each contact microphone may capture the vibrations emanating from the person, and the data from this array of contact microphones may be used to determine a source of the vibrations (i.e., sounds). An example of this method is to position three contact microphones on the person and triangulate the source of the vibrations. This may help locate a source of a disease state and help early diagnosis of diseases. For example, and not limitation, the data may determine whether the vibrations emanated from the upper lobe of a lung, a lower lobe of a lung, etc.

Another potential use for devices described herein may be to position an ACM at a joint space. Animal joints should produce little vibration from friction, and excess vibrations may indicate a disease state of the joint. Accordingly, the use of the devices described herein may be beneficial to diagnose disease states of joints within a subject. A source of a particular vibration may also be calculated by placing an array of ACMs at the joint space, as described above.

Another potential use for devices described herein is as a contact microphone to screen out unwanted air noise. For example, the embodiments of the devices described herein are not sensitive to air-borne acoustic emissions and are only sensitive to vibrations from its contact source. This characteristic of an ACM allows the device to be used as a vibration sensor to screen out any unwanted air-borne signals. One exemplary, and non-limiting, use of this characteristic may be to attach a MEMS device, as described herein, to a motorcycle so as to collect the vibrations emanating from the motorcycle. The contact microphone may relay the vibrations (i.e., sounds) of the motorcycle to a headset worn by the rider. The result would be that the rider only hears the sounds of the motorcycle, and any potential unwanted wind sounds would be removed from the output. The use of an ACM as a vibration sensor may also be employed on other automobiles.

It is to be understood that the embodiments and claims disclosed herein are not limited in their application to the details of construction and arrangement of the components set forth in the description and illustrated in the drawings. Rather, the description and the drawings provide examples of the embodiments envisioned. The embodiments and claims disclosed herein are further capable of other embodiments and of being practiced and carried out in various ways. Also, it is to be understood that the phraseology and terminology employed herein are for the purposes of description and should not be regarded as limiting the claims.

Accordingly, those skilled in the art will appreciate that the conception upon which the application and claims are based may be readily utilized as a basis for the design of other structures, methods, and systems for carrying out the several purposes of the embodiments and claims presented in this application. It is important, therefore, that the claims be regarded as including such equivalent constructions.

Furthermore, the purpose of the foregoing Abstract is to enable the United States Patent and Trademark Office and the public generally, and especially including the practitioners in the art who are not familiar with patent and legal terms or phraseology, to determine quickly from a cursory inspection the nature and essence of the technical disclosure of the application. The Abstract is neither intended to define the claims of the application, nor is it intended to be limiting to the scope of the claims in any way. Instead, it is intended that the invention is defined by the claims appended hereto.

What is claimed is:

1. A device comprising:
a suspended proof mass; and
a sensing electrode separated from the suspended proof mass by a sub-micron sensing gap;
wherein the device:
is sensitive to vibrations from a contact source;
is without sensitivity to air-borne acoustic emissions;
has an operational bandwidth ranging from DC to 10 k Hz;
is configured to sense frequencies in both:
a range of from DC to 20 Hz resultant from tilt and/or motion; and
a range of from 20 Hz to 10 k Hz resultant from vibration and/or acoustics;
operates in vacuum of smaller than or equal to 50 Torr; and has out-of-plane sensitivity and micro-g resolution.

2. The device of claim 1, wherein;
the contact source is a human body; and
the device is configured to capture wideband cardio- and pulmonary-induced vibrations from chest wall movements in an infrasonic range of from DC to 20 Hz.

3. The device of claim 2, wherein the out-of-plane sensitivity of the device enables mounting and placement of the device onto skin of an individual as the device has unidirectional sensitivity to sounds emanating from the human body and relatively orthogonal to a surface of the skin.

4. The device of claim 1, wherein the device is hermetically-sealed.

5. The device of claim 1, wherein the sub-micron sensing gap is a nano sensing gap.

6. A hermetically-sealed contact microphone device comprising:
a suspended proof mass; and

a nano-gap capacitive electrode separated from the suspended proof mass;

wherein the device;

has out-of-plane sensitivity;

is sensitive to vibrations from a contact source;

is without sensitivity to air-borne acoustic emissions;

has micro-g resolution;

has an operational bandwidth ranging from DC to 10 k Hz;

is configured to sense frequencies in both:

a range of from DC to 20 Hz resultant from tilt and/or motion; and a range of from 20 Hz to 10 k Hz resultant from vibration and/or acoustics; and operates in a vacuum of smaller than or equal to 50 Torr.

7. The device of claim 6 further comprising a nano-gap capacitive damping electrode;

wherein the:

suspended proof mass is suspended by a supporting flexure;

device has a resonant frequency of greater than 10 k Hz; and resonant frequency of the device is tunable via adjustment of one or more dimensions of the supporting flexure.

8. The device of claim 7 further comprising a substrate;

wherein the:

supporting flexure is attached to the substrate;

first proof mass is configured to move out-of-plane of the substrate; and device has a vibration acceleration sensitivity of better than 10 µg√Hz.

9. The device of claim 8, wherein the device comprises an out-of-plane differential accelerometer.

10. An out-of-plane differential accelerometer comprising:

a suspended proof mass; and a sensing electrode separated from the suspended proof mass by a nano sensing gap;

wherein the out-of-plane differential accelerometer:

has out-of-plane sensitivity and micro-g resolution;

is configured to sense frequencies in both:

a range of from DC to 20 Hz resultant from tilt and/or motion; and a range of from 20 Hz to 10 k Hz resultant from vibration and/or acoustics; and has a resonant frequency of greater than 10 k Hz.

11. The out-of-plane differential accelerometer of claim 10 further comprising:

a torsional tether; and one or more additional sensing electrodes;

wherein:

the suspended proof mass comprises hinged portions rotatable about the torsional tether;

each sensing electrode is separated from the hinged portions of the suspended proof mass by a nano capacitive gap;

the out-of-plane differential accelerometer has an operational bandwidth ranging from DC to 10,000 Hz determined by the resonant frequency of the out-of-plane differential accelerometer; and the resonant frequency of the out-of-plane differential accelerometer is tunable via adjustment of a width of one or more of the nano capacitive gaps.

12. The out-of-plane differential accelerometer of claim 11 further comprising a substrate;

wherein:

the torsional tether is attached to the substrate;

the suspended proof mass is configured to move out-of-plane of the substrate;

the out-of-plane differential accelerometer is hermetically-sealed and configured to maintain a vacuum environment of smaller than or equal to 50 Torr; and at least one of:

the hinged portions of the proof mass are each substantially thicker than the sensing electrodes;

the hinged portions of the proof mass are mirror symmetric;

the out-of-plane differential accelerometer has tri-axial vibration sensitivity including in the normal direction to the plane of the substrate and in the plane of the substrate; or the out-of-plane differential accelerometer has a vibration acceleration sensitivity of better than 100 µg√Hz.

13. A contact microphone device comprising:

a vacuum casing; and the out-of-plane differential accelerometer of claim 12 contained in the vacuum casing;

wherein the out-of-plane differential accelerometer has a frequency response ranging from DC to 10,000 Hz with relatively constant sensitivity.

14. The contact microphone device of claim 13, wherein the out-of-plane differential accelerometer has a sensitivity of better than 10 µg√Hz.

15. The contact microphone device of claim 13, wherein the out-of-plane differential accelerometer has a sensitivity of better than 100 µg√Hz.

16. A method comprising:

capturing, with an out-of-plane differential accelerometer, vibrations emanating from a person;

wherein the out-of-plane differential accelerometer comprises:

a suspended proof mass; and a sensing electrode separated from the suspended proof mass by a nano sensing gap; and wherein the out-of-plane differential accelerometer:

has out-of-plane sensitivity and micro-g resolution;

is configured to sense frequencies in both:

a range of from DC to 20 Hz resultant from tilt and/or motion; and a range of from 20 Hz to 10 k Hz resultant from vibration and/or acoustics; and has a resonant frequency of greater than 10 k Hz.

17. The method of claim 16 further comprising:

placing the out-of-plane differential accelerometer upon at least one of skin of the person or a fabric contacting skin of the person.

18. The method of claim 17, wherein the out-of-plane differential accelerometer is disposed within at least one of a stethoscope, a wristwatch, a necklace, a wearable strap, a patch, or a sensor.

19. A method of localizing sounds in a patient comprising:

placing two or more out-of-plane differential accelerometers upon a patient;

capturing vibrations, with at least one of the out-of-plane differential accelerometers, emanating from the patient; and determining a source of the vibrations by calculating a
vibration acceleration level at least one of the out-of-
plane differential accelerometers capturing vibrations;
wherein each out-of-plane differential accelerometer
comprises:
a suspended proof mass; and
a sensing electrode separated from the suspended proof
mass by a nano sensing gap; and
wherein each out-of-plane differential accelerometer:
has out-of-plane sensitivity and micro-g resolution;
is configured to sense frequencies in both:
a range of from DC to 20 Hz resultant from tilt
and/or motion; and
a range of from 20 Hz to 10 k Hz resultant from
vibration and/or acoustics; and
has a resonant frequency of greater than 10 k Hz.
20. The method of claim 19, wherein:
capturing comprises capturing wideband cardio- and pul-
monary-induced vibrations from chest wall movements
in an infrasonic range of from DC to 20 Hz; and
the out-of-plane sensitivity of the out-of-plane differential
accelerometers enable mounting and placement of the
out-of-plane differential accelerometers onto skin of
the patient as the out-of-plane differential accelerom-
eters have unidirectional sensitivity to sounds emanat-
ing from the patient and relatively orthogonal to a
surface of the skin.
21. The method of claim 20, wherein:
one or more of the out-of-plane differential accelerom-
eters further comprise:
a substrate;
a torsional tether attached to the substrate; and one or more additional sensing electrodes;
wherein:
the suspended proof mass comprises hinged portions
rotatable about the torsional tether and is config-
ured to move out-of-plane of the substrate;
each sensing electrode is separated from the hinged
portions of the suspended proof mass by a nano
capacitive gap;
the hinged portions of the proof mass are each
substantially thicker than the sensing electrodes;
and
the hinged portions of the proof mass are mirror
symmetric; and
each out-of-plane differential accelerometer:
has an operational bandwidth ranging from DC to
10,000 Hz determined by a tunable resonant fre-
quency of greater than 10 k Hz of the respective
out-of-plane differential accelerometer, the resonant
frequency being tunable via adjustment of a width of
one or more of the nano capacitive gaps;
is hermetically-sealed and configured to maintain a
vacuum environment of smaller than or equal to 50
Torr;
is configured to sense frequencies in both:
a range of from DC to 20 Hz resultant from tilt
and/or motion; and
a range of from 20 Hz to 10 k Hz resultant from
vibration and/or acoustics; and
has a vibration acceleration sensitivity of better than
100 $\mu g\sqrt{Hz}$.

* * * * *